US012677822B2

(12) United States Patent
Charipar et al.

(10) Patent No.: US 12,677,822 B2
(45) Date of Patent: Jul. 14, 2026

(54) CULTIVATING METHODS AND APPARATUSES

(71) Applicant: LAUDANDO & ASSOCIATES LLC, Chico, CA (US)

(72) Inventors: Nicholas Charipar, Alexandria, VA (US); Chris Laudando, Chico, CA (US); Matt O'Brien, Livermore, CA (US)

(73) Assignee: LAUDANDO & ASSOCIATES LLC, Chico, CA (US)

( * ) Notice: Subject to any disclaimer, the term of this patent is extended or adjusted under 35 U.S.C. 154(b) by 175 days.

(21) Appl. No.: 18/457,151

(22) Filed: Aug. 28, 2023

(65) Prior Publication Data

US 2023/0397597 A1     Dec. 14, 2023

Related U.S. Application Data

(63) Continuation-in-part of application No. PCT/US2022/070878, filed on Feb. 28, 2022.
(Continued)

(51) Int. Cl.
*A01M 21/04*     (2006.01)
*A01B 39/18*     (2006.01)
(Continued)

(52) U.S. Cl.
CPC ............. *A01M 21/04* (2013.01); *A01B 39/18* (2013.01); *C23C 16/24* (2013.01); *C23C 16/56* (2013.01);
(Continued)

(58) Field of Classification Search
CPC ........ A01M 21/04; A01B 39/18; C23C 16/24; C23C 16/56; G02B 1/002; G02B 13/06;
(Continued)

(56) References Cited

U.S. PATENT DOCUMENTS 6,178,224 B1 *   1/2001   Polichar ................ G01T 1/2928
                                                          378/98.2
9,565,848 B2     2/2017   Stowe et al.
(Continued)

OTHER PUBLICATIONS

Fahey et al. "Active and Passive Electro-Optical Sensors for Health Assessment in Food Crops"; Sensors 2021, 21, 171.*
(Continued)

*Primary Examiner* — Mohamed K Amara

(57)     ABSTRACT

A cultivator for damaging undesirable plants in an agricultural setting is disclosed. Embodiments of the cultivator include one or more energy emitters that stress target biological material, and the energy emitters in particular embodiments stress plants in at least two different ways, such as imparting light at certain wavelengths that cause dual effect stressors to the plant, such as heat related stress and photochemical stress similar to a sunburn. Some embodiments include a focusing system that spreads out narrow light beams and/or brings multiple light beams together at a point that is outside the cultivator. Some focusing systems cause multiple light beams to initially diverge before converging. Some embodiments utilize unusually large mirrors to capture, for example, multiple light pathways, and direct them to the target. Advantages include the ability to accomplish weeding and/or thinning with very low overall power consumption while moving quickly through a field.

19 Claims, 16 Drawing Sheets

Related U.S. Application Data

(60) Provisional application No. 63/154,662, filed on Feb. 26, 2021.

(51) Int. Cl.

| | |
|---|---|
| *C23C 16/24* | (2006.01) |
| *C23C 16/56* | (2006.01) |
| *G02B 1/00* | (2006.01) |
| *G02B 13/06* | (2006.01) |
| *G02B 27/00* | (2006.01) |
| *G02B 27/10* | (2006.01) |
| *G03F 7/16* | (2006.01) |
| *H04N 25/13* | (2023.01) |
| *G02B 3/00* | (2006.01) |
| *G02B 5/20* | (2006.01) |

(52) U.S. Cl.
CPC ............. *G02B 1/002* (2013.01); *G02B 13/06* (2013.01); *G02B 27/0025* (2013.01); *G02B 27/1013* (2013.01); *G03F 7/168* (2013.01); *H04N 25/134* (2023.01); *G02B 3/0056* (2013.01); *G02B 2003/0093* (2013.01); *G02B 5/201* (2013.01); *G02B 2207/101* (2013.01)

(58) Field of Classification Search
CPC ............ G02B 27/0025; G02B 27/1013; G02B 3/0056; G02B 5/201; G02B 2003/0093; G02B 2207/101; G03F 7/168; H04N 25/134
See application file for complete search history.

(56) References Cited

U.S. PATENT DOCUMENTS

| | | | | |
|---|---|---|---|---|
| 9,609,859 | B2 | 4/2017 | Stowe et al. | |
| 10,051,854 | B2 | 8/2018 | Stowe et al. | |
| 11,225,713 | B2 * | 1/2022 | Lock ........................ | H01B 5/14 |
| 11,690,369 | B2 | 7/2023 | Benjegerdes | |
| 12,201,044 | B2 * | 1/2025 | Palomares ........... | A01B 69/008 |
| 2002/0067553 | A1 * | 6/2002 | Maeda ............... | G02B 27/0025 |
| | | | | 359/810 |
| 2007/0206181 | A1 * | 9/2007 | Arenberg ................. | G02B 3/08 |
| | | | | 356/124 |
| 2008/0100917 | A1 * | 5/2008 | Golberg ............. | G02B 27/1013 |
| | | | | 359/615 |
| 2009/0009842 | A1 * | 1/2009 | Destain .................. | G03B 21/10 |
| | | | | 359/209.1 |
| 2015/0075068 | A1 | 3/2015 | Stowe | |
| 2015/0211083 | A1 | 7/2015 | Gabilondo | |
| 2017/0188564 | A1 * | 7/2017 | Stowe ..................... | G06F 18/24 |
| 2019/0104722 | A1 * | 4/2019 | Slaughter ............ | A01M 7/0089 |
| 2019/0331330 | A1 * | 10/2019 | Chen ..................... | G01J 5/0025 |
| 2020/0217785 | A1 * | 7/2020 | Quaderer ............... | G01N 21/35 |
| 2021/0076662 | A1 | 3/2021 | Mikesell | |
| 2021/0223395 | A1 * | 7/2021 | Valouch ................ | G01C 11/02 |

OTHER PUBLICATIONS

Tseng et al. "High spatio-temporal-resolution detection of chlorophyll fluorescence dynamics from a single chloroplast with confocal imaging fluorometer", Plant Methods (2017) 13:43.*
"Mirror Diameter vs. Laser Beam Diameter," Insights, ThorLabs. 2 pages (2020).
Crowell, B, "Optics," Light and Matter. 90 pages (1999).
"How to Build a Beam Expander," The WayBack Machine, Newport Corporation. 13 pages (2020).

* cited by examiner

100

110

130    120

130J

140J

Terminal Bud

Leaf

Stem

Root System

Tap Root

CULTIVATING METHODS AND APPARATUSES

This application is a continuation-in-part of PCT/US22/70878, filed 28 Feb. 2022, which claims the benefit of U.S. Provisional Application No. 63/154,662, filed Feb. 26, 2021, the entireties of which are hereby incorporated herein by reference. Any disclaimer that may have occurred during the prosecution of the above-referenced applications is hereby expressly rescinded.

FIELD

Embodiments of this disclosure relate generally to cultivating methods and apparatuses, and in particular embodiments to methods and apparatuses for targeting and damaging plants.

BACKGROUND

Cultivating crops to remove undesirable plants, frequently referred to as weeds, has traditionally been a labor intensive endeavor. Frequently teams of personnel walk or ride through crop fields (for example, fields of row crops) to locate and remove the undesirable plant material, typically by using their hands or hand tools, such as hoes or trowels, to damage or uproot the undesirable plants. Virtually all organic crops must employ manual labor crews for weeding since they are unable to use Genetically Modified Organism (GMO) seeds that are herbicide (for example, Roundup®) resistant.

Weeding is a process where an undesirable plant that is a different variety than what is desired, commonly referred to as a weed, is removed from the field. Thinning is a process where a plant that is of the desired variety is removed because it is less healthy than desired. Since not all seeds planted in a field grow in a desired fashion, planting multiple seeds in clusters of, for example, three (3) seeds and thinning the desirable plants to leave only the heartiest and/or most vigorous is a common practice.

There have been attempts at automating these processes, but it was realized by the inventors of the current disclosure that problems exist with automated cultivation methods and that improvements are needed. Certain preferred features of the present disclosure address these and other needs and provide other important advantages.

SUMMARY

Embodiments of the present disclosure provide an improved cultivating methods and apparatuses.

In accordance with a first aspect of embodiments of the present disclosure, a cultivator is disclosed, comprising a first stress energy generator that emits energy intended to stress undesirable plant material and means for directing the energy emitting from the first stress energy generator to reach an undesirable plant. The cultivator may also include means for determining a first location of the undesirable plant material and may also include means for directing the energy emitting from the first stress energy generator to reach the first location of undesirable plant material.

Some embodiments include an electronic sensor to sense undesirable plant material, and in some embodiments the undesirable plant material that is detected is a stem, a leaf or a terminal bud (apical meristem). Still other embodiments can include one or more radiation source energy emitters that emit radiation (for example, light and/or heat) toward the plant, and an aiming device (such as an electromechanical aiming device, a sight or a scope) to direct the stressor (for example, radiation) toward the plant can also be included.

One or more of the following stressors may be produced by one or more energy emitters: high intensity light, high brightness light, laser light, laser radiation, energy beams that may include high and low intensity regions, heat, and mechanical stress (for example, air movement or air pressure waves (for example, soundwaves)).

Embodiments include cultivators for damaging undesirable plants in an agricultural setting. Embodiments of the cultivator include one or more energy emitters that stress target biological material, and the energy emitters in particular embodiments stress plants in at least two different ways, such as imparting light at certain wavelengths that cause dual effect stressors to the plant, such as heat related stress and photochemical stress similar to a sunburn.

Some embodiments include a focusing system that spreads out narrow light beams and/or brings multiple light beams together at a point that is outside the cultivator. Some focusing systems cause multiple light beams to initially diverge before converging. Certain embodiments utilize unusually large mirrors to capture, for example, multiple light pathways, and direct them to the target.

Some embodiments include light directors that move the light beam over a target plant multiple times, with some light directors being underdamped to produce ringing in the motion of the light beam, and some that move the light beam in different directions near the main central stem of the target plant.

Some embodiments generate vapor and/or aerosol clouds to diminish the hazardous nature of light that may escape from the cultivator, especially from under the cultivator after reflecting off minerals in the soil.

Advantages realized by embodiments of the present disclosure include the ability to accomplish weeding and/or thinning with very low overall power consumption while moving quickly through a field. Additional advantages include the ability to effectively operate the cultivator with water moisture on the target plants, such as after a rain shower or after dew has formed on the plants. Further advantages include cultivators that are significantly lighter and capable of operating in wet fields when traditional laser based cultivators cannot, further facilitating injury to undesirable plants when the undesirable plants are still young and small, leading to increased throughput.

This summary is provided to introduce a selection of the concepts that are described in further detail in the detailed description and drawings contained herein. This summary is not intended to identify any primary or essential features of the claimed subject matter. Some or all of the described features may be present in the corresponding independent or dependent claims, but should not be construed to be a limitation unless expressly recited in a particular. Each embodiment described herein does not necessarily address every object described herein, and each embodiment does not necessarily include each feature described. Other forms, embodiments, objects, advantages, benefits, features, and aspects of the present disclosure will become apparent to one of skill in the art from the detailed description and drawings contained herein. Moreover, the various apparatuses and methods described in this summary section, as well as elsewhere in this application, can be expressed as a large number of different combinations and subcombinations. All such useful, novel, and inventive combinations and subcombinations are contemplated herein, it being recognized that the explicit expression of each of these combinations is unnecessary.

BRIEF DESCRIPTION OF THE DRAWINGS

Some of the figures shown herein may include dimensions or may have been created from scaled drawings. However, such dimensions, or the relative scaling within a figure, are by way of example, and not to be construed as limiting.

DETAILED DESCRIPTION OF THE ILLUSTRATED EMBODIMENTS

Figure 1:
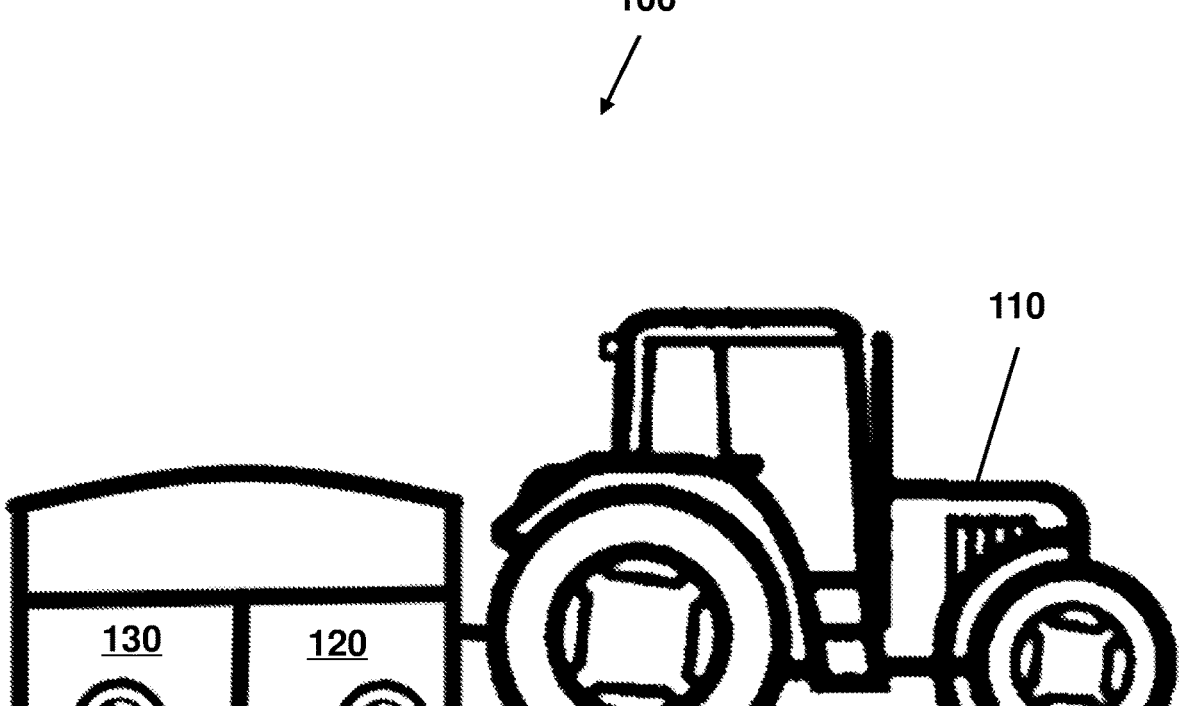
FIG. 1 is an illustration of a cultivator according to one embodiment of the present disclosure.

For the purposes of promoting an understanding of the principles of the disclosure, reference will now be made to one or more embodiments, which may or may not be illustrated in the drawings, and specific language will be used to describe the same. It will nevertheless be understood that no limitation of the scope of the disclosure is thereby intended; any alterations and further modifications of the described or illustrated embodiments, and any further applications of the principles of the disclosure as illustrated herein are contemplated as would normally occur to one skilled in the art to which the disclosure relates. At least one embodiment of the disclosure is shown in great detail, although it will be apparent to those skilled in the relevant art that some features or some combinations of features may not be shown for the sake of clarity.

Any reference to "invention" or "embodiment" within this document is a reference to an embodiment of a family of inventions, with no single embodiment including features that are necessarily included in all embodiments, unless otherwise stated. Furthermore, although there may be references to benefits or advantages provided by some embodiments, other embodiments may not include those same benefits or advantages, or may include different benefits or advantages. Any benefits or advantages described herein are not to be construed as limiting to any of the claims.

Likewise, there may be discussion with regards to "objects" associated with some embodiments of the present invention, it is understood that yet other embodiments may not be associated with those same objects, or may include yet different objects. Any advantages, objects, or similar words used herein are not to be construed as limiting to any of the claims. The usage of words indicating preference, such as "preferably," refers to features and aspects that are present in at least one embodiment, but which are optional for some embodiments.

Specific quantities (spatial dimensions, temperatures, pressures, times, force, resistance, current, voltage, concentrations, wavelengths, frequencies, heat transfer coefficients, dimensionless parameters, etc.) may be used explicitly or implicitly herein, such specific quantities are presented as examples only and are approximate values unless otherwise indicated. Discussions pertaining to specific compositions of matter, if present, are presented as examples only and do not limit the applicability of other compositions of matter, especially other compositions of matter with similar properties, unless otherwise indicated.

Embodiments of the present disclosure provide a cultivating apparatus, system and/or method for removing undesirable plant material from a field of plants. In at least one embodiment the cultivator generates energy with a stress energy generator and directs the energy toward an undesirable plant, or toward a particular part of an undesirable plant, in order to damage the plant. By damaging the plant the plant's growth can slow sufficiently so that it grows slower than the desirable plants (becomes a zombie plant that is not dead but its growth is severely stunted so that it does not inhibit the desired plant's growth) or dies, decreasing the amount of nutrients the damaged plant extracts from the soil and allowing the desirable plants to continue using more of the soil nutrients and continuing to grow.

Some embodiments apply heat, either alone or in combination with other stressors, to increase the temperature of the plant. The heat can be generated by one or more heat sources and can be applied using visible light, infrared radiation, microwave radiation, ultrasonic means, or mechanical means. Ultrasonic heating transfers ultrasonic energy from the source (for example, a transducer) to the target via various mechanisms such as, for example, direct contact or through a transfer medium (for example, free space or a waveguide). The absorption of this ultrasonic energy by the target results in heating and/or cavitation within the target. Heating by mechanical means typically relies on friction or conductive heat transfer.

Some embodiments apply a high intensity light source, either alone or in combination with other stressors, that induces a photochemical response in the plant. The photochemical response can include signaling transcripts and metabolites, which can induce a stress response. The photochemistry occurring under these conditions can also result in undesirable products, such as reactive oxygen species (ROS), which damages the plant by damaging the plant's cellular constituents. The high intensity light can be, for example, in the visible or ultraviolet portion of the electromagnetic spectrum and can be generated by one or more sources, such as an arc lamp, light emitting diode, or laser.

It was discovered that applying a combination of stressors to an undesirable plant can lead to enhanced degradation beyond that of when a single stressor is applied and, in appropriate circumstance with the application of the appropriate combination of stressors, the combination of stressors can lead to plant degradation that is greater than the sum of the individual stressors.

For example, applying high intensity light in the visible region of the spectrum where chlorophyll is active to a plant can stress the plant and cause the stoma within the plant to close, thereby reducing the amount of light being used by the plant for photosynthesis. Applying heat to the plant to elevate the temperature of the plant can stress the plant and cause the stomata to open, thereby increasing transpiration and cooling the plant. However, when high intensity light in the region where chlorophyll is active is applied at the same time as heat, the plant's normal reactions are at odds with one another as the plant cannot simultaneously open and close its stomata. The plant cannot address both stressors simultaneously resulting in the total stress being applied to the plant being greater than the combined effect of these two stressors when applied individually.

As one example, a target plant is irradiated with a spatially or temporally varying light source. At the higher intensity portions of the light the temperature of the region of the plant irradiated will increase resulting in injury to the plant, such as burning or cutting. At the lower intensity portions of the light the temperature of the plant increases, but does not result in thermal damage; however, the temperature increase can be great enough to induce signaling through stress specific transcripts and metabolites. This signaling can have a variety of results including opening of the stoma, programed cell death, and/or the generation of ROS.

Other types of stress that can be applied in combination with another type of stress include applying radiation that causes ablative (also referred to as mechanical) stress, such as when a laser rapidly heats the plant resulting in the vaporizing of plant tissue and/or water, and/or the carbonization of plant tissue through burning or cutting of the plant tissue.

FIG. 1 depicts a cultivator 100 according to embodiments of the present disclosure. Cultivator 100 includes one or more power sources 110, for example a tractor, one or more detectors 120 and one or more energy generators 130. The power source 110 provides power to the detector 120 and the energy generator 130. The detector 120 determines the location of undesirable plant material. The energy generator 130 generates energy that is directed to the undesirable plant material in order to stress an undesirable plant.

Note that while the power source 110 is depicted as being separate from the detector 120 and energy generator 130, alternate embodiments include cultivators 100 where the power source 110, detector 120 and energy generator are combined together in a single apparatus.

The detector in some embodiments is a user who will locate the undesirable plant material, and in some embodiments the user also aims the energy generator 130 in the direction of the undesirable plant material in order to damage the undesirable plant.

In some embodiments the energy generator generates electromagnetic radiation (which may be, for example, in the visible, infrared, ultraviolet or X-ray portions of the spectrum), and may be generated using a laser, maser, or other means of generating the desired radiation. In certain embodiments the energy discharged has a wavelength of at least 200 nm (nanometers) and at most 11,000 nm. In further embodiments the energy discharged has a wavelength of at least 300 nm and at most 1,600 nm. And, in still further embodiments the energy discharged has a wavelength of at least 400 nm and at most 750 nm. In some embodiment high brightness light (which may be, for example, light that is at a wavelength of 440 nm to 455 nm, or at a wavelength of 450 nm) may be directed toward the undesirable plant.

The radiation directed at the plant may have a higher intensity portion, which may be centrally located in an energy beam, and a lower energy portion. See, for example, FIG. 2. This type of radiation beam can cause thermal damage near the center and photochemical damage near the outside of the beam, simultaneously applying two types of stress to the plant. In some embodiments the energy distribution pattern is Gaussian in nature. This is one example of embodiments where multiple stressors are imparted to the plant in a single act. A laser energy emitter focused on the surface of a plant can simultaneously induce a heat stress in the center of the beam and a high intensity light stress on the periphery of the beam. Another example embodiment where multiple stressors are imparted to the plant in a single act can occur with selection of an appropriate wavelength radiation source, such as a light beam that will stress the plant both thermally and photochemically as described below.

Some embodiments include directing at least two separate radiation beams at undesirable plant material.

In some embodiment the energy generator generates mechanical energy, such as sound waves, which may be audible or inaudible (for example, infrasonic or ultrasonic sound), or moving air, which may be by directing high velocity air.

One or more aiming devices are included in some embodiments to aim the one or more energy generators 130 so that the energy emanating from the one or more energy generators 130 is directed toward the undesirable plant material. In some embodiments at least one energy generator 130 is on an articulated device on the cultivator 100, and the articulated device changes the orientation of the energy generator 130 with respect to the cultivator allowing the energy generator to be aimed. In alternate embodiments at least one energy generator 130 is in a fixed position on the cultivator 100 such that when the cultivator 100 moves through a field and the aiming device includes a timer that allows the energy from the energy generator to propagate to the undesirable plant material at a specific time when the fixed position energy generator 130 will be pointing at the undesirable plant material. In still further embodiments at least one energy generator 130 is in a fixed position on the cultivator 100 and the energy emanating from the energy generator 130 is aimed, such as by using reflectors and/or lenses.

In some embodiments the aiming device aims the energy emanating from the energy generator 130 at a leaf of an undesirable plant and in some embodiments the aiming device aims the energy emanating from the energy generator 130 at the stem (and/or the terminal bud) of an undesirable plant.

The amount of time the energy source applies energy to the plant can also have an effect on the type of stress imparted to the plant. For example, when a stressor is applied to the plant for a long exposure duration, such as when the plant perceives the application of the stressor as a steady state condition (for example, minutes or hours), certain reactions within the plant result. Even when a stressor is applied to the plant for a medium duration exposure, such as when the plant is exposed for time on the order of one to a few seconds, similar reactions can occur within the plant. However, it was also determined that very short exposures, possibly as short as 10-100 ms (milliseconds) with high intensity light or higher radiant heat can create the desired responses within the plant.

When two types of stress energy are simultaneously directed to the plant, the overall effect can be more impactful than if the two types of stress energy are individually directed to the plant at different times. Some embodiments apply two types of stress energy to the plant simultaneously, and some embodiments apply two types of stress energy to the plant at different times.

Figure 2:
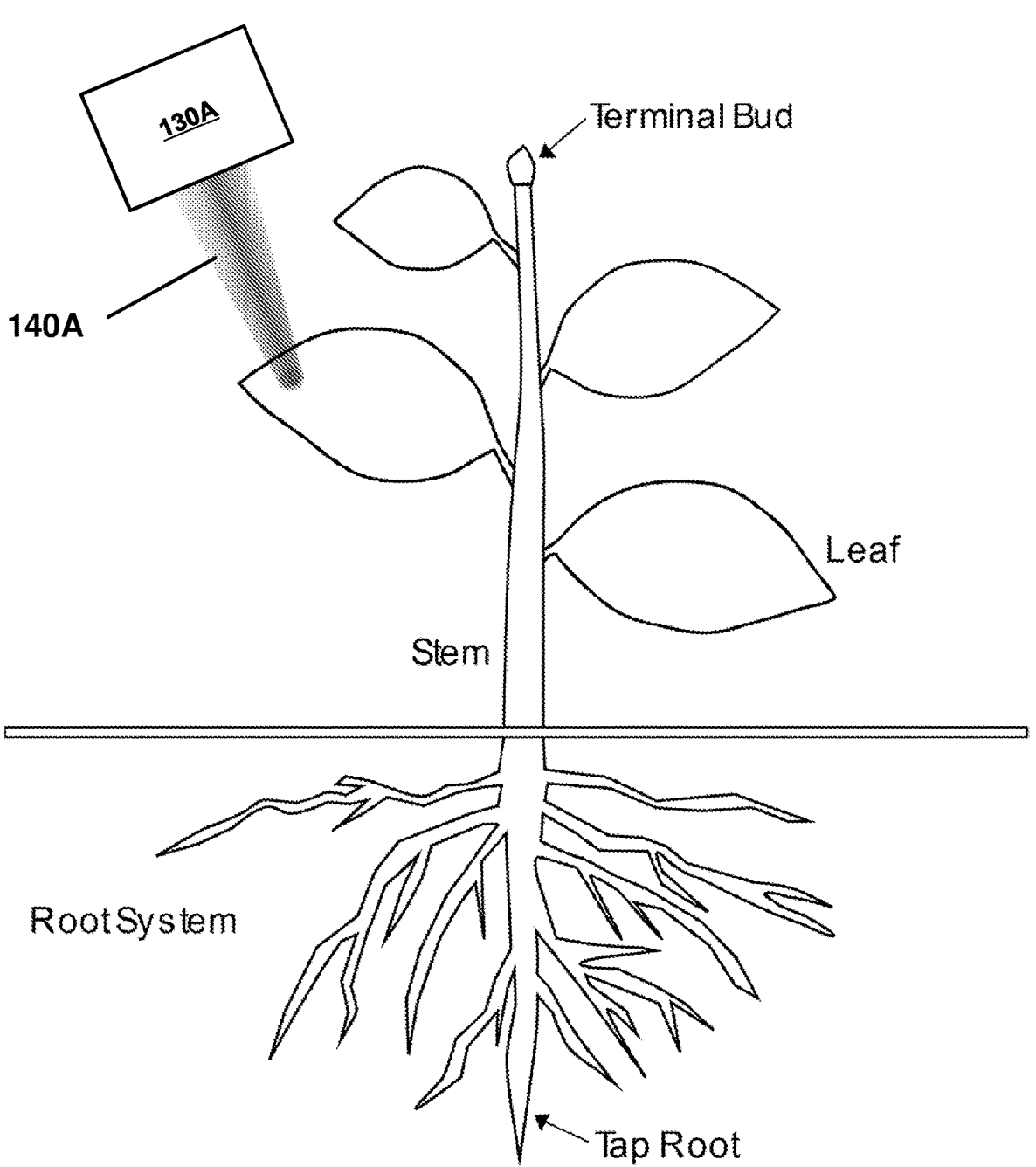
FIG. 2 is an illustration of an energy emitter radiating a beam with a spatially varying distribution onto a leaf of an undesirable plant according to one embodiment of the present disclosure.

Different embodiments utilize different combinations of the types of stress energy disclosed herein. For example, depicted in FIG. 2 is a single laser beam 140A emanating from a laser 130A, which may include a Gaussian beam profile for spatially varying intensity. Here, a single energy emitter 130A can provide high heat and/or high light intensity.

Figure 3:
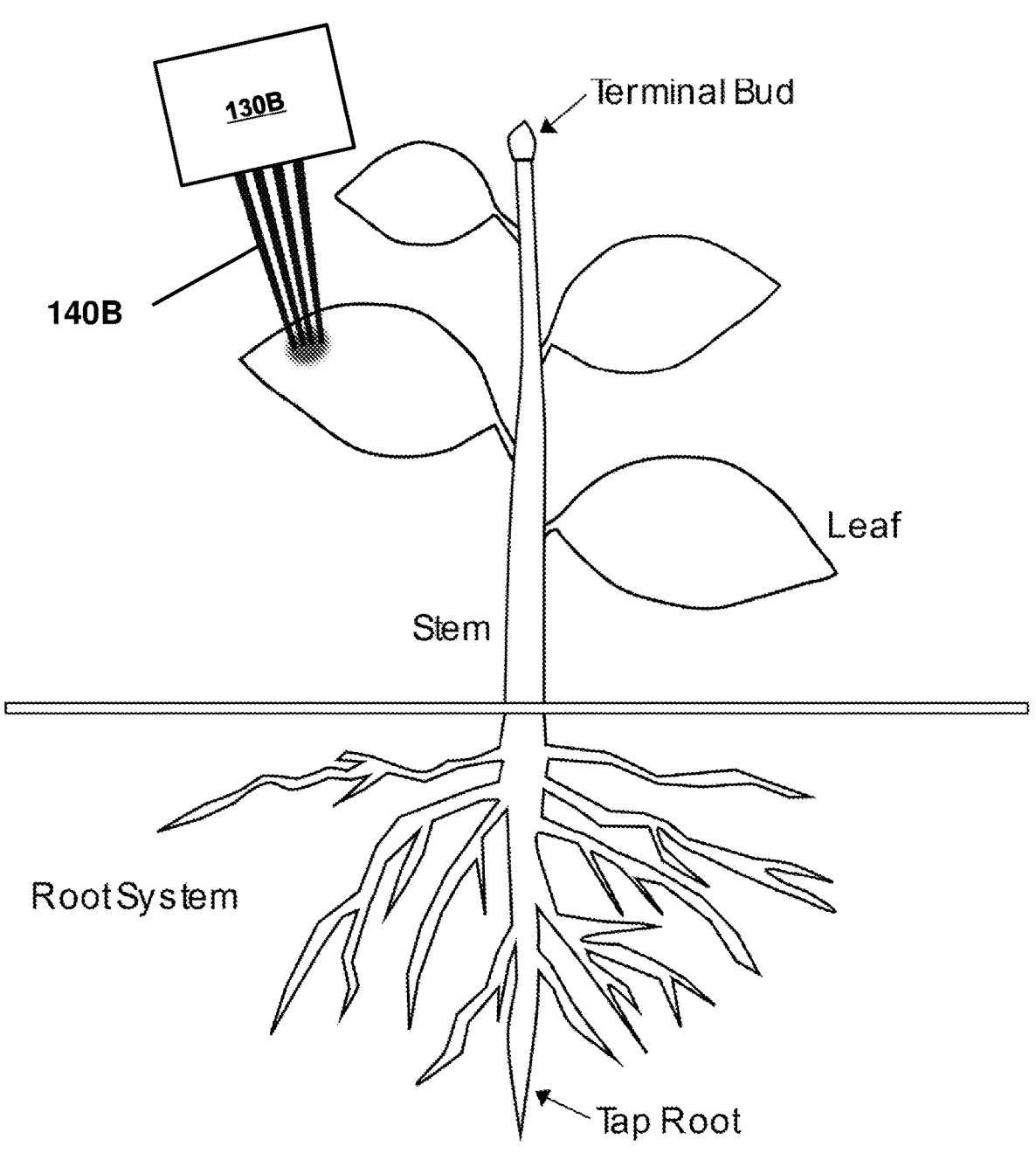
FIG. 3 is an illustration of one or more energy emitters, or sources, radiating multiple beams onto a leaf of an undesirable plant according to another embodiment of the present disclosure.

As another example, FIG. 3 depicts multiple high intensity beams 140B with a low intensity region between adjacent beams being generated by energy emitter 130B. In some embodiments the high intensity beams 140B are generated by multiple sources (for example, lasers), while in some embodiments the beams are generated by a single source (for example, a laser) whose beam is separated into multiple beams. Here, a single source provides both high heat and high light intensity.

Figure 4:
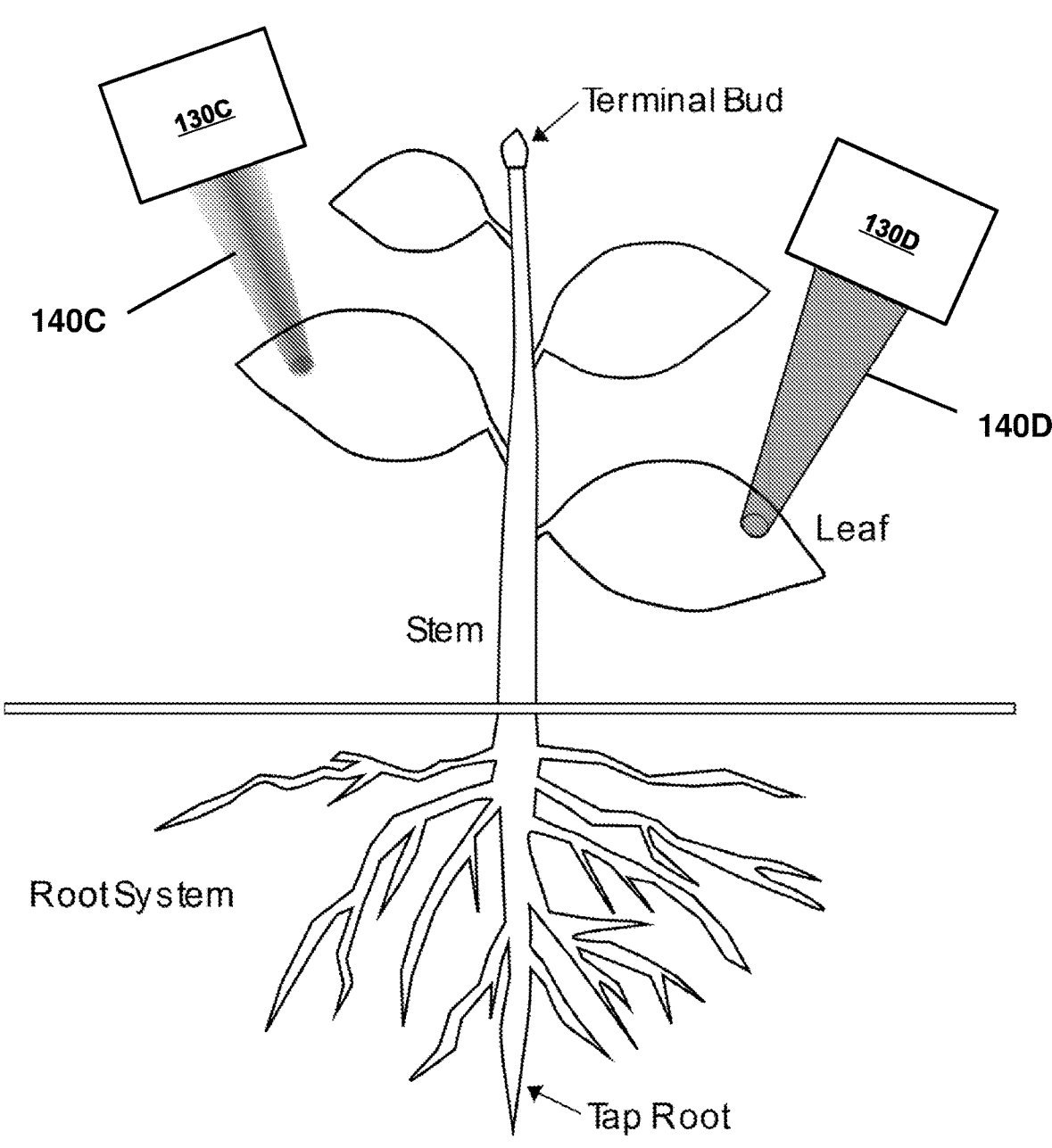
FIG. 4 is an illustration of an energy emitter radiating a beam with a spatially varying distribution onto one leaf of an undesirable plant and an energy emitter radiating heat onto another leaf of the undesirable plant according to still another embodiment of the present disclosure.

FIG. 4 is an illustration of non-collated stressors. In this illustration a spatially varying beam 140C (for example, high light intensity) generated by an energy emitter 130C (for example, a laser 130C) and a high heat source radiation 140D are applied to the plant. In one example embodiment, the high heat source 140D is generated by a light source 130D, such as by one or more lasers, one or more laser diodes, and/or one or more light emitting diodes (LEDs).

Figure 5:
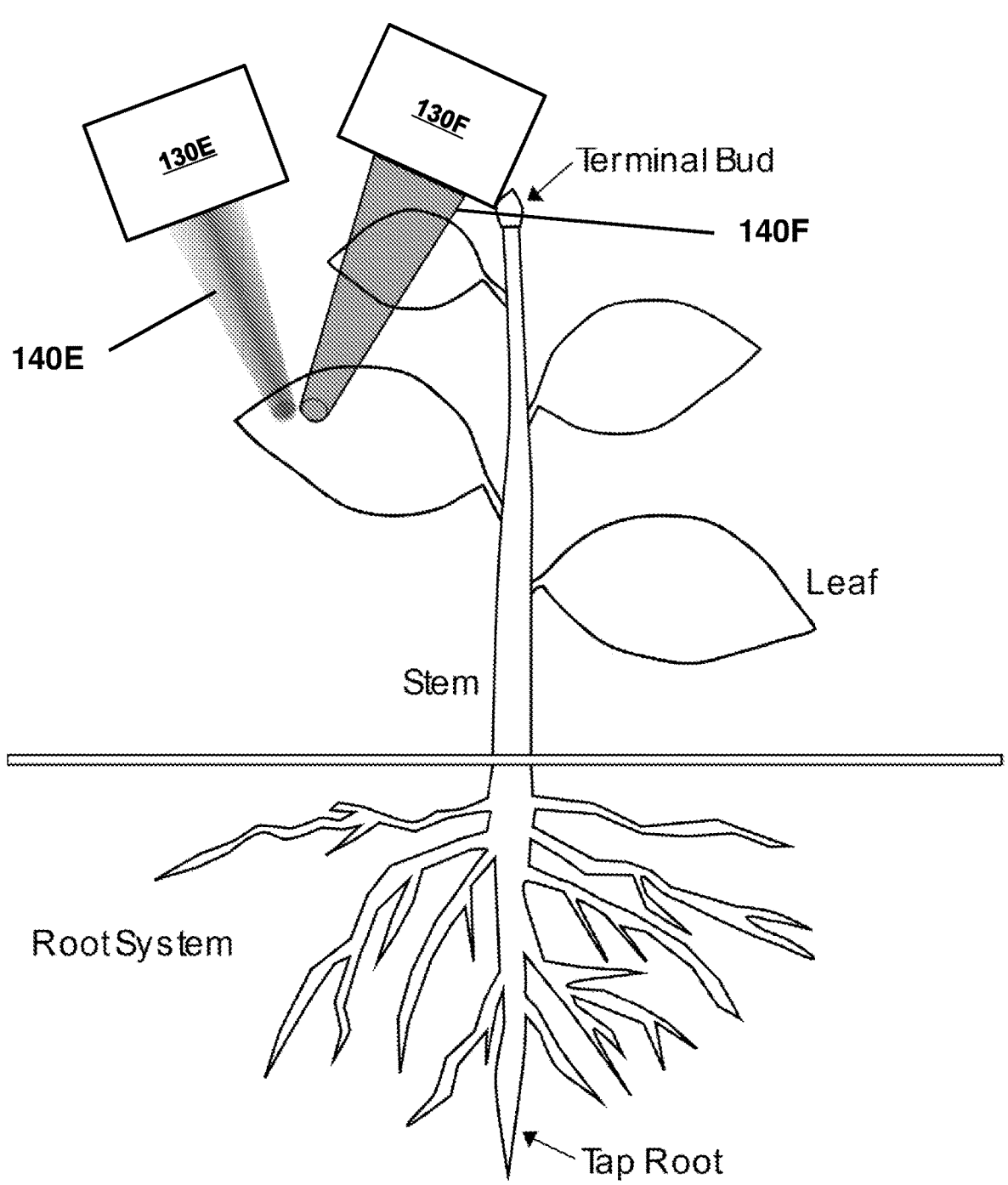
FIG. 5 is an illustration of an energy emitter radiating a beam with a spatially varying distribution onto one leaf of an undesirable plant and an energy emitter radiating heat onto the same leaf of the undesirable plant according to yet another embodiment of the present disclosure.

Depicted in FIG. 5 is an illustration of collated stressors including a spatially varying beam 140E (for example, high light intensity) being generated by energy source 130E and high heat 140F being generated by heat source 130F. The high heat source 130F may include a light source, such as one or more lasers, laser diodes, LEDs, etc.

Figure 6:
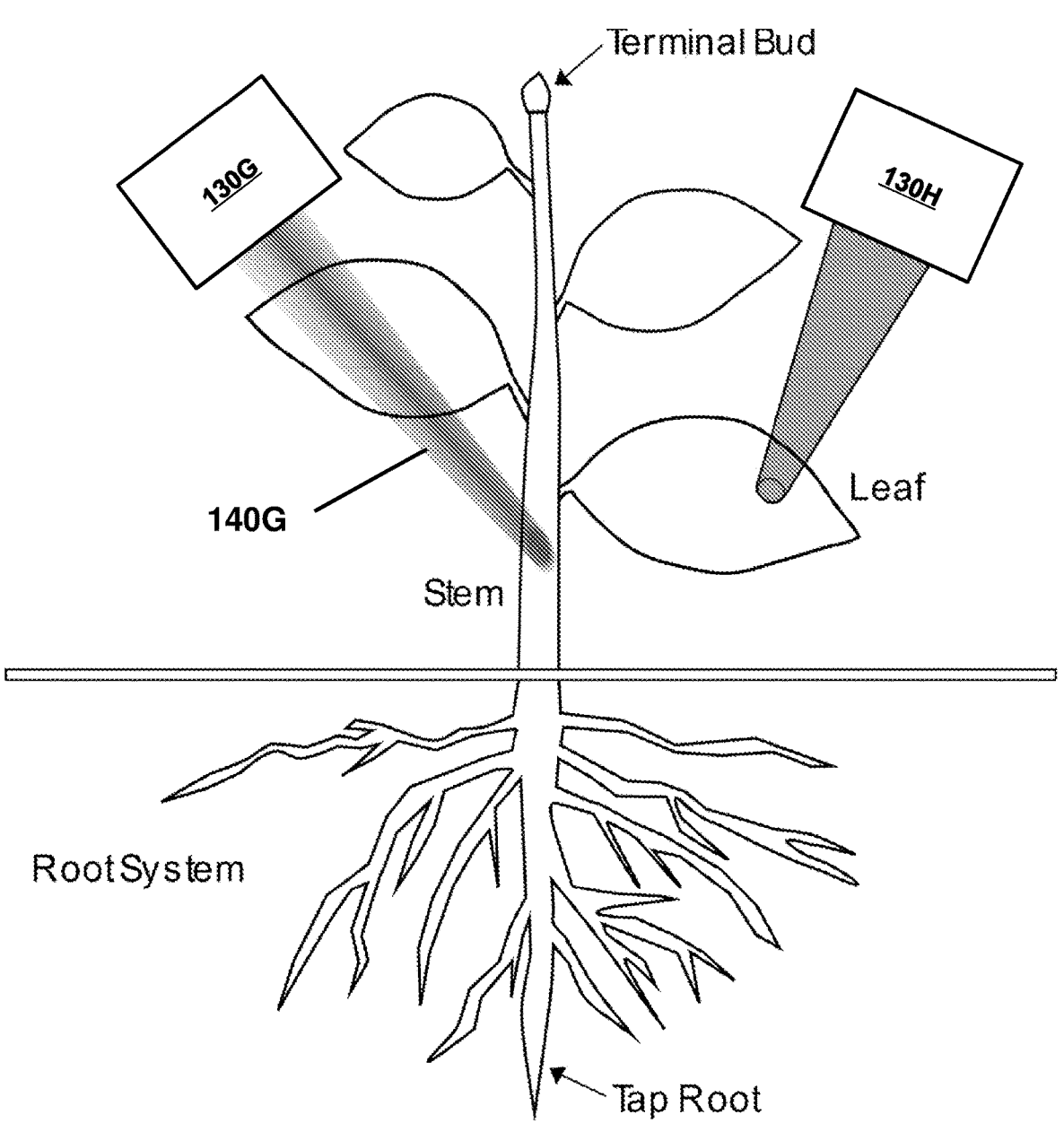
FIG. 6 is an illustration of an energy emitter radiating a beam with a spatially varying distribution onto the stem of an undesirable plant and an energy emitter radiating heat onto a leaf of the undesirable plant according to a further embodiment of the present disclosure.

FIG. 6 is an illustration of non-collated stressors (for example, stressors that target different portions of the same plant) including a spatially varying beam 140G (for example, high light intensity) generated by an energy emitter 130G, and high heat 140H being generated by a heat source 130H. The high heat source may include one or more lasers, laser diodes, and/or LED light sources 130H. Also illustrated in an example targeting system where, for example, the high light intensity 140G is focused on a stem and the high heat source 140H is focused on a leaf of the same plant.

Figure 7:
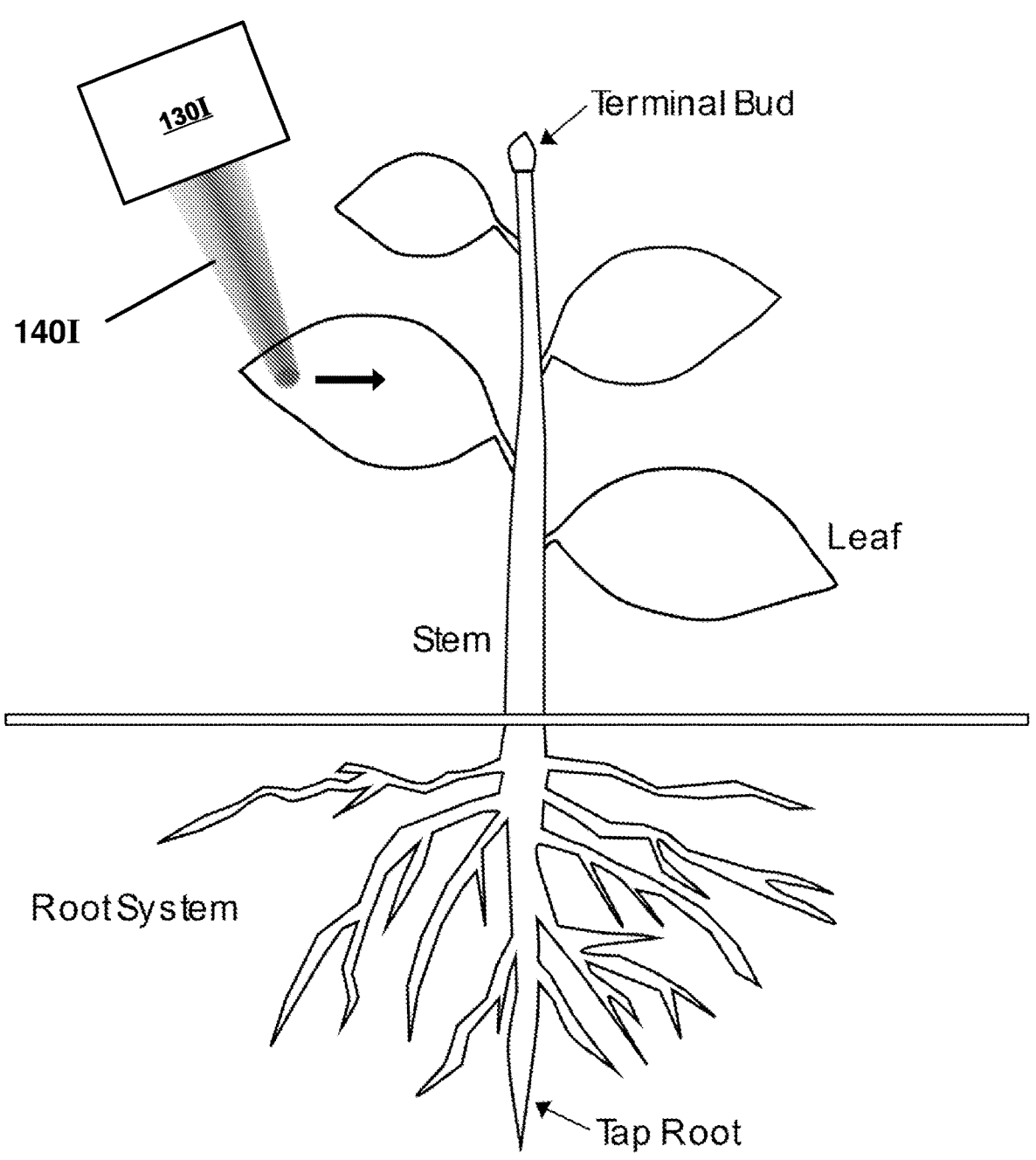
FIG. 7 is an illustration of an energy emitter radiating a beam with a spatially varying distribution onto a leaf of an undesirable plant and moving the beam across the leaf according to still a further embodiment of the present disclosure.

Depicted in FIG. 7 is an illustration of a single laser beam 140I with a Gaussian (or nearly a Gaussian) beam profile that spatially varies the intensity on the plant's surface. Here, a single source 130I provides both high heat and high light intensity. In some embodiments the light intensity and the heat intensity are controlled by dynamic scan speed. At high speeds, the plant is subjected to high light intensity while at low speeds the plant is subject to high heat.

Figure 8:
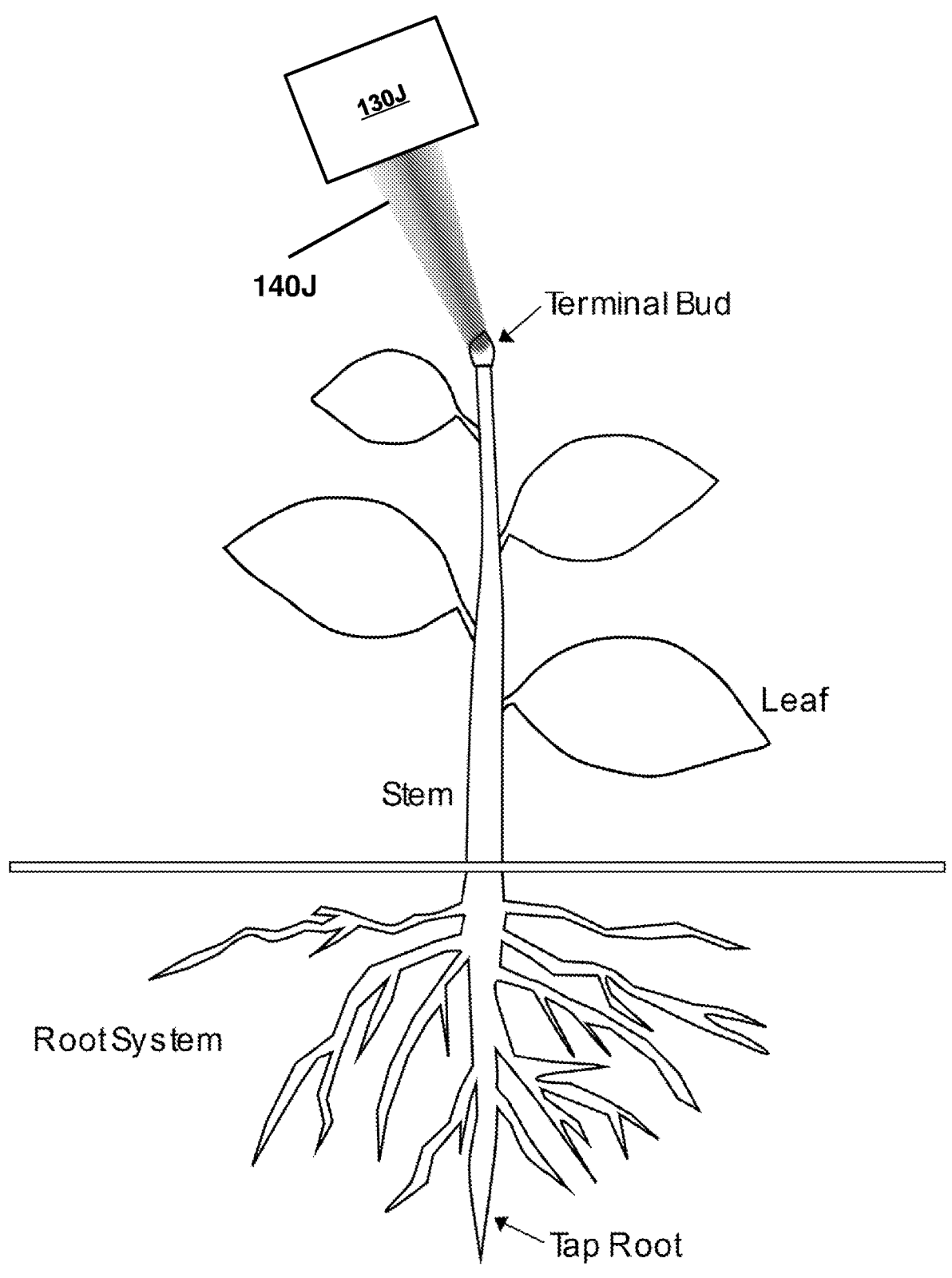
FIG. 8 is an illustration of an energy emitter radiating a beam with a spatially varying distribution onto a terminal bud of an undesirable plant according to yet a further embodiment of the present disclosure.

Depicted in FIG. 8 is an illustration of a single laser beam 140J with a Gaussian (or nearly a Gaussian) beam profile that spatially varies the intensity on the plant's surface. Here, a single source 130J provides both high heat and high light intensity to the terminal bud. In some embodiments the light intensity and the heat intensity are controlled by dynamic scan speed. At high speeds, the plant is subjected to high light intensity while at low speeds the plant is subject to high heat.

Some embodiments use a handheld stress energy generator that can be directed (for example, aimed) by a user toward the undesirable plant material, optionally with an aiming assistance device (such as a sight or scope), while other embodiments utilize an automated mechanism (such as an electronic sensor) for determining the location of the undesirable plant and directing (such as aiming) the stress energy generator to emit its energy at the desired location.

Some embodiments stress the undesirable plant using light in the visual spectrum, and in particular embodiment that stress the undesirable plant in the part of the spectrum where plant absorbance is enhanced (such as wavelengths where chlorophyll absorption occurs) have advantages. In some embodiments the energy emitter includes high power laser diodes that emit light in the visible spectrum, which tend to be energy efficient. Visible lasers can have approximately ten times higher absorption than 1 $\mu$m (one micrometer) lasers, thereby reducing power requirements approximately tenfold. $CO_2$ lasers emitting in or around the 10.6 $\mu$m (micrometer) range can produce strong heat stress but do not appear to produce an efficient photo response and, therefore, do not appear as well suited to impart multiple stressors to an undesirable plant as visible light lasers, although further research is being conducted. Although some high power visible laser diodes may have lower beam quality and brightness than solid state or gas lasers, this effect can be compensated by applying this type of high intensity light along with another stressor, such as heat, rather than simply emitting a high intensity beam, such as for cutting the plant. In some embodiments a high brightness light source simultaneously provides high intensity light and heat. In other embodiments the light source applies a combination of stressors, for example, two or more of the following: high intensity light, heat, and mechanical stress.

Other advantages of embodiments of the present disclosure include the ability to achieve a higher degree of degradation when using a combination of stressors, which can result in lower energy requirements to operate the cultivator 100 while still achieving a sufficient level of degradation.

Some embodiments imparting multiple stressors to the target plant use a single source, while others use multiple sources. For example, some embodiments include two different lasers (for example, one for heat and one for light), while others include a single laser that varies the beam in space (spatially) and/or in time (temporally).

Some embodiments are configured for utilization during drought where the high intensity light and/or heat are adapted for drought conditions and can require less energy than embodiments that are configured for utilization during an ideal growing season.

Still some embodiments move air, such as by using blowers or compressed gas, to impart stress to the plant, which may be performed simultaneously (or nearly simultaneously) with the application of high intensity light.

While certain combinations of stressors are addressed herein, this is not to be construed as limiting. Additional embodiment include application of two or more stressors as described herein in different combinations in order to produce a desired degradation of biological material.

Depicted in FIGS. 9-12 is a cultivator 200 according one or more embodiments of the present disclosure, and represents at least one example embodiment of cultivator 100 depicted in FIG. 1. Cultivator 200 includes an energy emitter (for example, a light generating system 210) that generates an energy beam (for example, a light beam 229), an optional focusing system 220, a light directing system 230, and an optional target tracking system 260.

Light generating system 210 includes one or more light sources (for example one or more laser diodes 212 and/or one or more light emitting diodes (LEDs)), and an optional cooling system 211, such as a fan and/or finned heat sinks. The one or more light sources (laser diodes 212) generate wavelengths in ranges intended to damage biological material (for example, plants) as described above. Example wavelengths emitted by the light sources in embodiments of the present disclosure include wavelengths discussed above and/or wavelengths that cause multi-stressors to the plant material. For example, embodiments of the present disclosure utilize wavelengths that are readily absorbed by organic matter and produce a dual effect in that the absorbed light is readily converted to heat within the organic matter, which stresses the plant in a first manner, and also causes a photochemical reaction within the organic matter (for example, in a manner similar to causing a sunburn), which stresses the plant in a second manner. Using these wavelengths produces an increased effect for less energy (and/or cost) in that a lower energy (and/or less expensive to generate) beam incident on an undesirable plant causes similar effects in disabling or killing the undesirable plant as much higher energy (and/or more expensive to generate) beams at different wavelengths.

The wavelength emitted by the light source impacts system operation and efficiency. Advantages of embodiments in which the light sources emit light in certain wavelengths (for example, blue light) include an increased ability to obtain increased effect for less power (and/or cost). Blue light can induce a photochemical response in addition to causing thermal and/or mechanical (cutting/burning) damage to a target plant, which for example when weeding can be a weed or when thinning can be a crop plant. Certain frequencies of blue light can be absorbed by the chlorophyll and can, therefore, be more quickly absorbed by the target plant. While embodiments utilizing traditional lasers (for example, $CO_2$ lasers) are nevertheless useful, the energy absorbed by the target plant in these embodiments is absorbed roughly equally by the plant and the water within the plant, resulting in some energy being wasted in heating water with its relatively high specific heat rather than the weed structure. Moreover, there can be an efficiency penalty if multiple laser beams are combined into a single beam before being directed toward the target as compared to having the individual beams converge and/or overlap at the target. Still further, from a commercial efficiency perspective the availability and cost of light sources in particular wavelengths can be more advantageous than others. For example, while embodiments utilizing ultraviolet (UV) LEDs may have acceptable performance characteristics, these types of LEDs are difficult to manufacture and can be expensive for utilization in an agricultural device (such as embodiments of this present disclosure) that operates outdoors in a much more rugged and uncontrolled environment than with indoor applications and will, therefore, likely require frequent repair and/or replacement. As another example, traditional lasers (such as various gas or excimer lasers) are used as a light source in certain embodiments; however, these types of lasers are typically inefficient (efficiencies of 30% or less) and have large power requirements, making them difficult for use in an agricultural environment.

Advantages of embodiments utilizing blue LEDs is their ability to be easily manufactured, resulting in low cost, and are relatively efficient at converting electrical energy to light energy. However, some drawbacks of embodiments utilizing blue light LEDs include the light being typically broad spectrum (some energy is converted to wavelengths that are not as helpful at achieving the desired effect as other wavelengths), which can result in requiring more LEDs to supply the appropriate power at the desired wavelengths, the light being very divergent (spread out and not very directional), which can result in a need for additional lenses for focusing in order to produce the appropriate reaction it the biological material being targeted, and the LEDs having performance issues in a harsh and rugged agricultural environment where the frequencies can readily change with outside air temperature and frequent failures requiring replacement.

Advantages of embodiments utilizing laser diodes include the light from laser diodes being collimated and very directional (propagates in narrow pathways). Examples include laser diodes used for commercial laser light displays in the entertainment industry and laser diodes used in the image projection and printer industry. However, many of these inexpensive laser diodes are significantly impacted by temperature variations requiring additional temperature management systems when operating in a harsh agricultural environment. Additional difficulties associated with laser diodes is that they tend to have relatively low intensity and multiple laser diodes may be necessary to produce the appropriate reaction in the biological material being targeted. Nevertheless, embodiments of the present disclosure use lenses to bring multiple different laser diode light sources and pathways together at a target in order to supply sufficient power to produce the appropriate reaction the biological material.

Embodiments of the present disclosure utilize light sources (for example, blue laser diodes and/or blue LEDs) that emit light in the blue visual spectrum, while some embodiments utilize light sources that emit light within or close to the ultraviolet (UV) range. Additional embodiments utilize light sources that emit light at one or more wavelengths from 250-500 nanometers (nm), while further embodiments utilize light sources that emit light at one or more wavelengths from 365-488 nm, and still further embodiments utilize light sources that emit light at one or more wavelengths from 430-480 nm.

The length of time the light is incident on the target plant also impacts system operation and efficiency. Having the light remain on the target plant past the point where the plant is sufficiently damages wastes time and energy, slowing down the device as it moves through the field and requiring more power than is needed to produce the appropriate reaction in the plant material. Exposure times exceeding 500 milliseconds (ms), or ½ second, tend to be too long since the plant will be over-damaged (for example, burned) at the typical power and wavelengths used with embodiments of the present disclosure. Still further, having a dwell time of greater than 500 ms will slow down the device's movement through the filed to a point where it becomes less useful and/or require too many systems (for example, multiple cultivators 200) on a single agricultural device increasing the total power requirements, cost and complexity to a level where the commercial value of the device is diminished. Conversely, exposure times that are too short can result in the biological material being left undamaged or not sufficiently damaged to obtain the desired results. Embodiments of the present disclosure have exposure (dwell) times on the target material for at least 1 ms, which can be less than the time it takes the one or more galvanometers 244 to reposition the light onto a different target (which takes approximately 10 ms in some embodiments) according to embodiments of this disclosure. Additional embodiments of the present disclosure have exposure times on the target material for at least 10 ms and at most 250 ms, while further embodiment have exposure times on the target for approximately 100 ms.

Still further, the intensity of the light at the target plant will also impact system operation and efficiency. For example, embodiments of the present disclosure utilize a minimum light power intensity of 200 Watts per square centimeter ($W/cm^2$), which was determined to sufficiently damage plant material (in some examples caused the plant to wilt) in a sufficient time at the desired power levels required to operate the system, while embodiments of the present disclosure utilize a maximum power light intensity of 5,000 $W/cm^2$ (5 $kW/cm^2$), which was determined to damage the plant material to such an extent (in some examples cut completely through the plant) that using more power did not change the result and effectively wasted power and/or cut through the plant material and cause injury to biological material located behind the target.

Embodiments of the present disclosure require less energy (fewer Joules) per target plant and can operate at a lower power (some embodiments requiring magnitudes less power than other systems), and in some embodiments can move more quickly through a field than systems using more power. Some embodiments impart a total energy to the target biological material from 0.5 Joules per square centimeter ($J/cm^2$) to 500 $J/cm^2$. Additional embodiments impart a total energy to the target biological material from 1 $J/cm^2$ to 125 $J/cm^2$. Still further embodiments impart a total energy to the target biological material from 5 $J/cm^2$ to 50 $J/cm^2$.

Embodiments of the present disclosure direct light with wavelengths from 250 to 500 nanometers (nm) and optical power intensities from 100 to 5,000 Watts per square centimeter ($W/cm^2$) onto the target biological material for 1 to 500 milliseconds (ms). Further embodiments direct light with wavelengths from 365 to 488 nm and optical power intensities from 300 to 1,000 $W/cm^2$ onto the target for 25 to 300 ms. And still further embodiments direct light with wavelengths from 430 to 480 nm and power intensities from 500 to 900 $W/cm^2$ onto the target biological material for 100 to 200 ms.

Nevertheless, there can be challenges in utilizing certain light sources such as laser diodes and/or LEDs in a cultivator. For example, laser diodes and LEDs do not typically generate a sufficiently intense light beam by themselves to damage a target (for example, an undesirable plant) in a sufficiently short time to be effective for use in a cultivator that needs to cultivate entire fields of crops within a reasonable amount of time. Therefore, when using these types of light sources an additional system, such as a focusing system, are used by embodiments of the present disclosure to assist in producing sufficient intensity at the target plant. Nevertheless, the hardware and/or components used in embodiments of the present disclosure to effectively utilize light sources such as laser diodes and LEDs are sufficiently available and at a lower cost than what is required in embodiments utilizing other types of light sources, such as gas lasers, that may not require additional hardware and/or components such as focusing systems. As such, advantages realized by embodiments using light sources such as laser diodes and/or LEDs include the ability to manufacture and maintain a product that is more cost effective and, therefore, more desirable in the agricultural setting.

In at least one embodiment utilizing laser diodes, laser diodes 212 in the light generating system 210 are arranged in an array 214. See, for example, FIG. 11. Each laser diode 212 in the array 214 is a separate light source producing a narrow light pathway that is collected by focusing system 220.

Some embodiments of the present disclosure utilize a focusing system 220. Focusing system 220 includes one or more lenses that focus the light 229 emanating from the one or more light sources and manipulate the light emanating from the one or more light sources to cause the desired level of damage to the target plant.

In at least one example embodiment (see, for example, FIG. 11) two lenses (lens 222 and lens 224) capture the light 229 emanating from the one or more laser diodes 212 and direct the individual beams (which from the laser diode have narrow pathways) to coalesce (for example, converge) at a distance that equals the expected distance between the focusing system 220 and the target material. Instead of having the light pathways focused before leaving the cultivator 200 so that the one or more light pathways propagate relatively unchanged between the cultivator 200 and the target plant, some embodiments manipulate the one or more light pathways so they continue to change (for example, internally (as in the cross-sectional shape/intensity of the light pathway changing) and/or in relation to one another (as in the pathways converging)) after leaving the cultivator 200.

One of the difficulties encountered with embodiments utilizing a light source that generated light in narrow pathways (for example, embodiments with an array 214 of laser diodes 212) was that when the one or more individual light beams reached the target, the intensity of the light in each of the narrow beams was so high that it would simply burn the plant resulting in only one stressor being applied to the plant. Moreover, the one stressor that was applied to the plant could affect such a small area on the target plant that the stress (for example, creation of a hole in the plant) was so small (for example, only a small pinhole was created) that it did not have a sufficiently large effect on the plant to cause the desired level of damage. Even with multiple small holes created with an array of narrow light beams, the levels of damage and/or the number of stressors applied to the plant could be less than desired.

To help achieve the desired level of damage and/or create more than one stressor, a lens system was utilized in some embodiments to manipulate the beams emanating from the light source. In some embodiments (for example, embodiments utilizing an array 214 of laser diodes 212) two lenses are used, for example, to first expand the individual beams and/or diverge the separate beams from one another, and second to bring the beams together, which may be done to have the beams converge at a distance equal to the expected distance to the target plant. By manipulating the one or more light beams in these ways it is possible to have the one or more light beams create a more uniform intensity across the desired spot size (for example, 1 cm²) at the target distance, which can result in application of multiple stressors to the target plant using the one or more light sources. In certain embodiments the intensity is fairly uniform across the spot size at the target distance; however, in alternate embodiments the intensity varies enough to create hot spots that can act as one stressor (such as a burning heat) while the intensity outside the hot spots is sufficient to case a second stressor (such as a photochemical response similar to a sunburn).

In one example embodiment (see, for example, FIG. 11), the first lens 222 is a concave lens and the second lens 224 is a convex lens. In another example embodiment, both lenses 222 and 224 are convex. Because of the initial expansion of the one or more light beams, the second lens may be larger in diameter than the array of laser diodes. For example, while in one embodiment the array 214 of laser diodes 212 occupies and area of approximately 1 in² (one square inch), the diameter of the second lens 224 is approximately 2 inches. Aperture 221 may be approximately the same size as the second lens 224.

In one example embodiment, the distance 226 that lens 222 is positioned from the laser diode array 214 is 25 mm (approximately 1 inch) and the distance 227 lens 224 is positioned from lens 222 is 55 mm (approximately 2.2 inches). Note that the distance 226 is measured from the back of the laser diode array 214 package. In an example embodiment the focal length of lens 222 is –150 mm (negative 150 millimeters) and the focal length of lens 224 is 175 mm. In still further embodiments the lenses are AR coated from 350-700 nm.

Some light sources (for example, laser diodes and LEDs) may have one or more lenses incorporated into each device, sometimes referred to as lenslets or micro-lenses. The lenses described with respect to the focusing system 220 (for example, first lens 222 and second lens 224) are additional to the lenses that may be incorporated into the one or more light sources.

Some embodiments utilize two or more light source arrays (such as one or more arrays 214 of laser diodes 212), that are combined (such as by using a beam combiner, and in certain embodiments a polarizing beam combiner to minimize losses), which can produce higher power light at the target.

In example embodiments the array 214 of laser diodes 212 produces an array of light beams that are approximately 1 inch in diameter. In additional example embodiments, the diameter of aperture 221 is approximately 2 inches in diameter. In example embodiments the multiple separate beams (which may be described as a diffuse beam) coalesce downstream of (beyond) the light directing system 230. In additional example embodiments the multiple separate beams coalesce in free space outside the physical boundaries of cultivator 200. In some embodiments the individual beams coalesce at a target distance of approximately 1 meter from the cultivator 200, while in further embodiments the beams coalesce at a target distance of approximately 1 meter from the aperture 221 of the focusing system 220. In example embodiments the individual beams coalesce into an approximate 12 mm² area "spot" (for example, a 3.5 mm×3.5 mm square or a 4 mm diameter) or smaller target area at the target distance when the target is located directly below the cultivator 200, and in additional embodiments the individual beams coalesce into a 1 cm² area "spot" or smaller at the target distance when the target is located directly below the cultivator 200. When the target is not directly below the cultivator 200, the spot size may be as much as 64 mm² (an 8 mm×8 mm square or a 9 mm diameter) when the target is approaching the typical usable boundary of the target field 290, which in some embodiments is at approximately 60 degrees from vertical. Some example embodiments utilize an array of LEDs instead of the array of laser diodes with the same or similar parameters as described in relation to the array of laser diodes.

While some embodiments include a single high quality laser with a narrow beam (for example, a $CO_2$ laser) as the light source and, therefore, may not include a focusing system 220, embodiments utilizing a more diffuse light source (for example, multiple light sources such as multiple laser diodes and/or LEDs) also have certain advantages. For example, embodiments utilizing a diffuse light source (such as multiple light sources (e.g., a laser diode and/or LED array) or a less expensive laser) and a focusing system 220 that focuses the light generated by the multiple light sources at a location that is at or near the distance of the optical pathway between the focusing system 220 and the location of the expected target exhibit improved safety since the intense portion of the light pathway that can cause pain or injury to a user is located only near the target reducing, if not eliminating, the possibility of injuring a user working on or around the cultivator 200 unless the worker places his/her hand in the target zone while the light sources are illuminated. A worker accidentally putting a hand in or around the vicinity of the cultivator 200, where the light beam can be approximately 2 inches in diameter when leaving the physical boundaries of cultivator 200, will not be injured.

Other advantages of embodiments utilizing multiple light sources include a lower cost of manufacture since each individual light source can generate lower power light than if one light source is used, and lower power light sources tend to be less expensive and more easily acquired, lowering the cost of manufacture and maintenance. For example, a laser diode array is typically much less expensive than a "high quality" laser, for example, a $CO_2$ laser. Still further, embodiments utilizing a single light source will become inoperative if the single light source malfunctions. Similarly, embodiments utilizing a small number of light sources (for example, 2 or 3 light sources) as opposed to a large number of light sources (for example, 20 light sources) are more affected and will become less effective, or possibly ineffective, if one light source malfunctions. Moreover, replacing one or more lasers will typically be more difficult than replacing one or more laser diode and/or LED arrays. Embodiments of the present disclosure include a light source with an array of 10 or more laser diodes while additional embodiments include a light source with an array of 20 or more laser diodes (which may be, for example, in a 4×5 array with dimensions of, for example, 1 inch by 1.5 inches). Nevertheless, embodiments utilizing one or more lasers have advantages that include the ability to generate higher power for damaging the targets and smaller reflectors and motion systems can be utilized.

The light directing system 230 (which may also be referred to as a steering system) takes the light 229 produced by the light generating system 210 and the focusing system 220, and directs the light 229 in a desired direction. For example, light directing system 230 directs the light 229 toward one or more targets, such as one or more plants. Light directing system 230 includes one or more reflecting systems, such as reflecting system 240 and reflecting system 250, that are capable of changing the direction of the light beam 229, such as by rapidly moving the light beam 229 from one target to another target. Reflecting system 240 includes a reflector 242 (such as a mirror) and a motion system that rotates reflector 242 about axis 249. Reflecting system 250 includes a reflector 252 (such as a mirror) and a motion system that rotates reflector 252 about axis 259.

The one or more motion systems move the one or more reflective surfaces and change the direction of the light 229. For example, in the illustrated embodiment the motion system for the reflecting system 240 (for example, a motor such as galvanometer 244) rotates reflector 242 about axis 249 and a separate motion system for reflecting system 250 (for example, galvanometer 254) rotates reflector 252 about axis 259. In the illustrated embodiment, the two galvanometers 244 and 254 work in concert with one another to rapidly position the light beam 229 at a desired location within the target field 290. While some embodiments include a light directing system 230 with a single reflector (or a single light beam director) that is able to redirect the light in two dimensions, embodiments utilizing two reflecting systems have certain advantages. For example, while it may be difficult to have two reflecting systems work together to direct the light 229 toward a desired target, the hardware needed to implement such a system is widely available and is available at a lower cost than other types of reflecting or light directing systems used in alternate embodiments, resulting in a product that is more cost effective to manufacture and maintain if/when a portion of the light directing system needs maintenance and/or replacement. Light 229 is depicted with single arrows to show the general direction the light 229 propagates; however, the single arrow can represent the direction or propagation of a single narrow beam, multiple narrow beams, a diffuse "beam," or multiple diffuse "beams."

Figure 9:
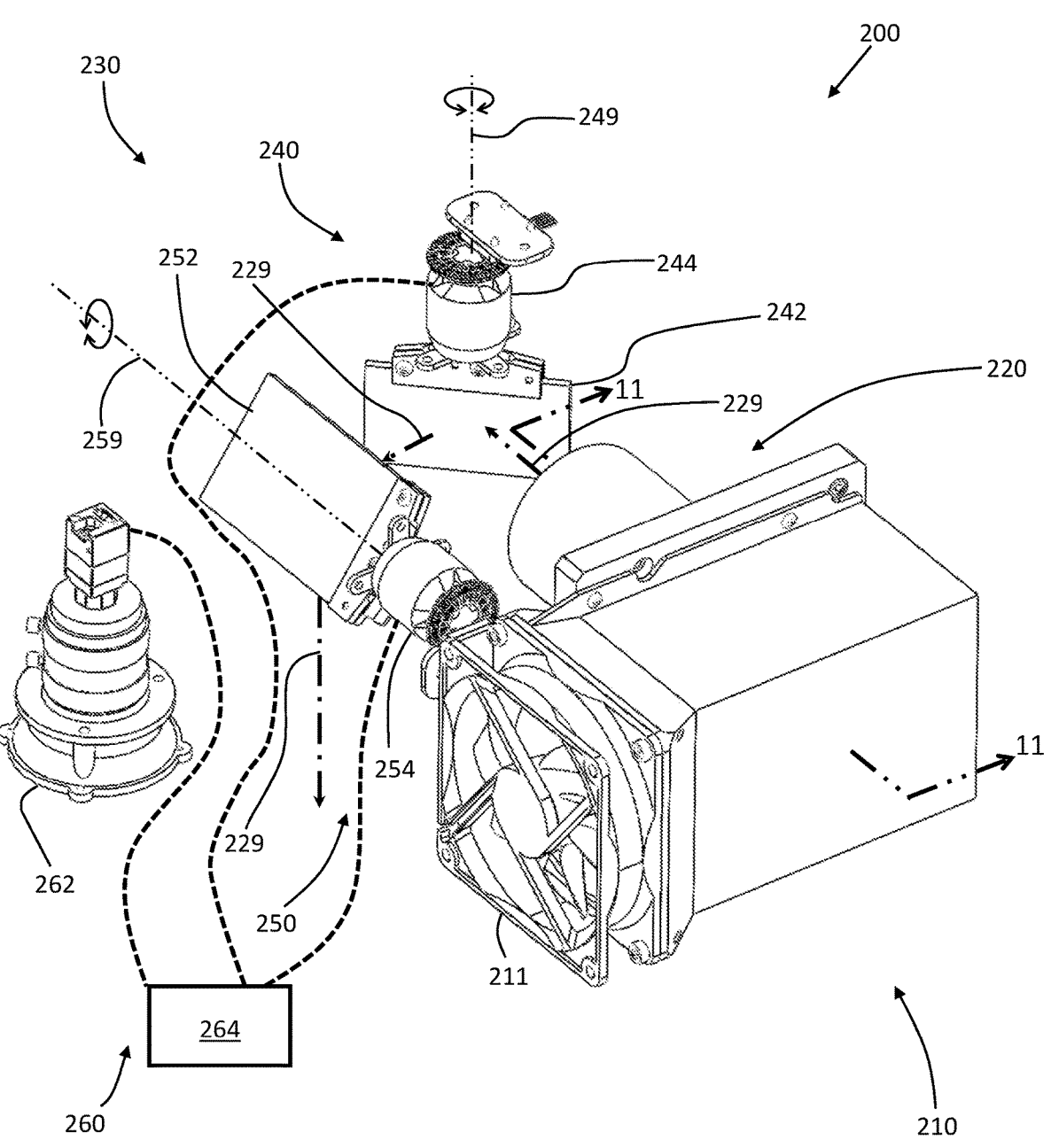
FIG. 9 is a perspective view of a cultivator according to another embodiment of the present disclosure.
Figure 10:
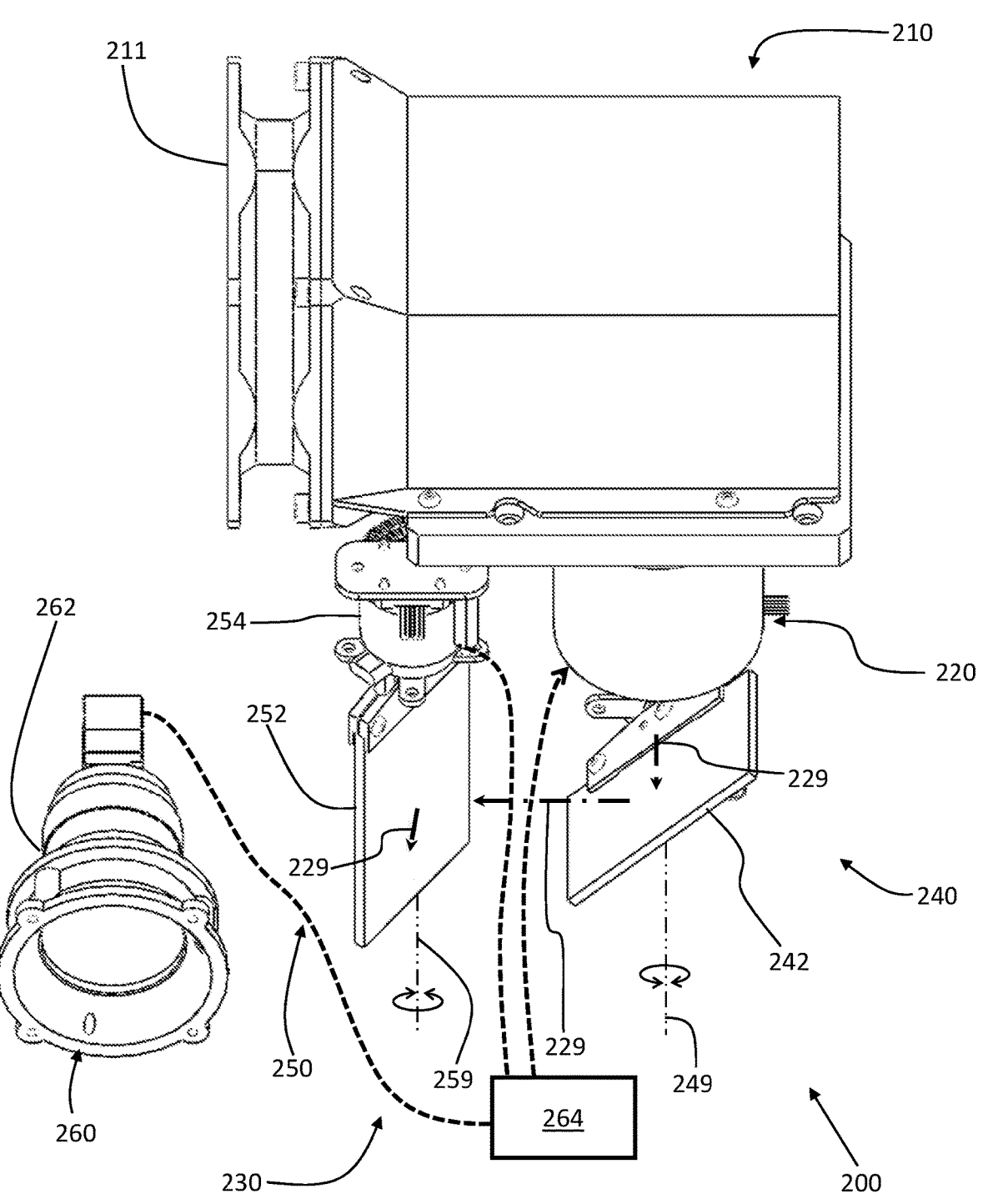
FIG. 10 is an alternate perspective view of the cultivator depicted in FIG. 8.
Figure 11:
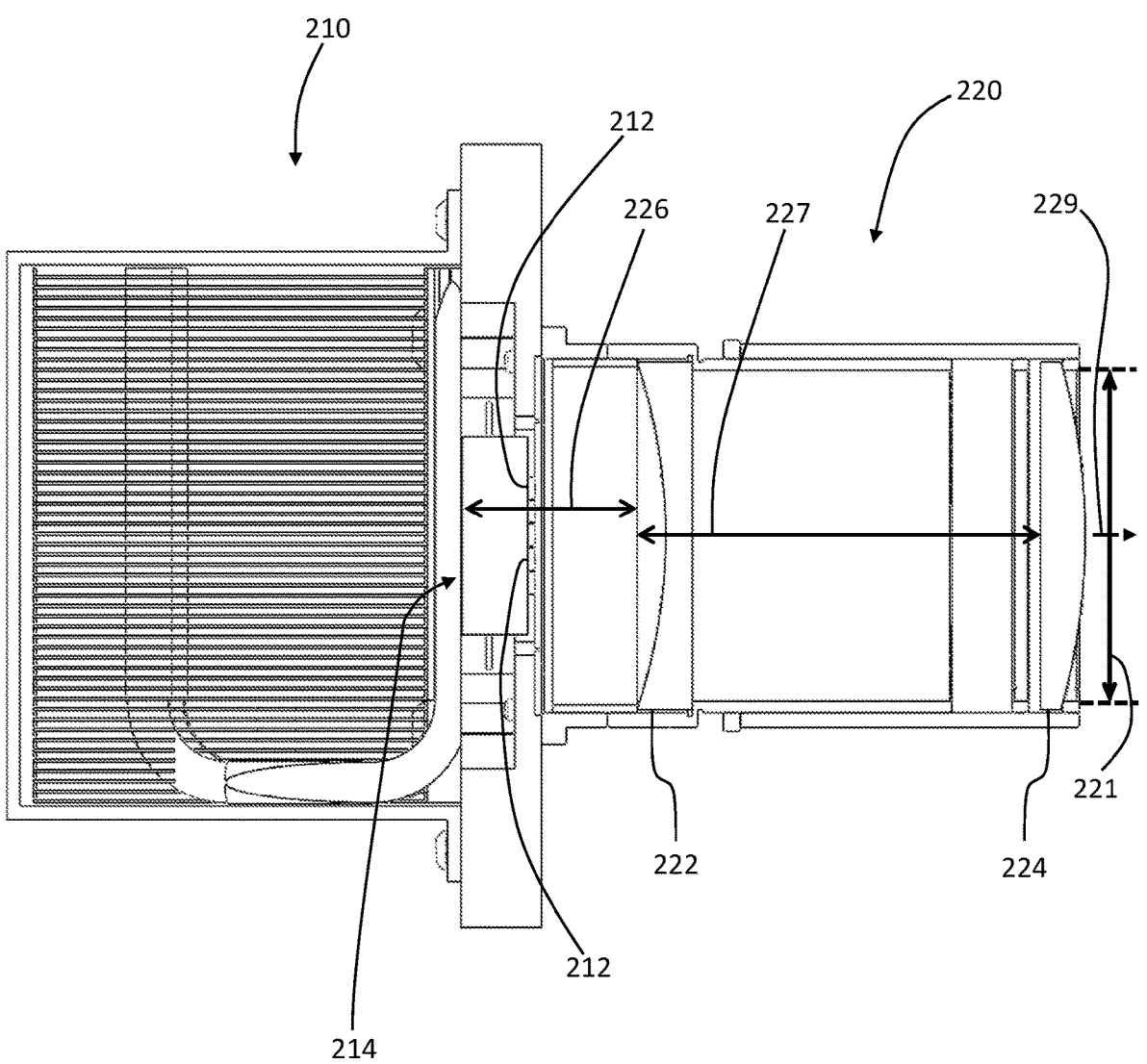
FIG. 11 is a cross-sectional view of the light generating and focusing systems of the cultivator depicted in FIG. 9 taken along line 11-11.
Figure 12:
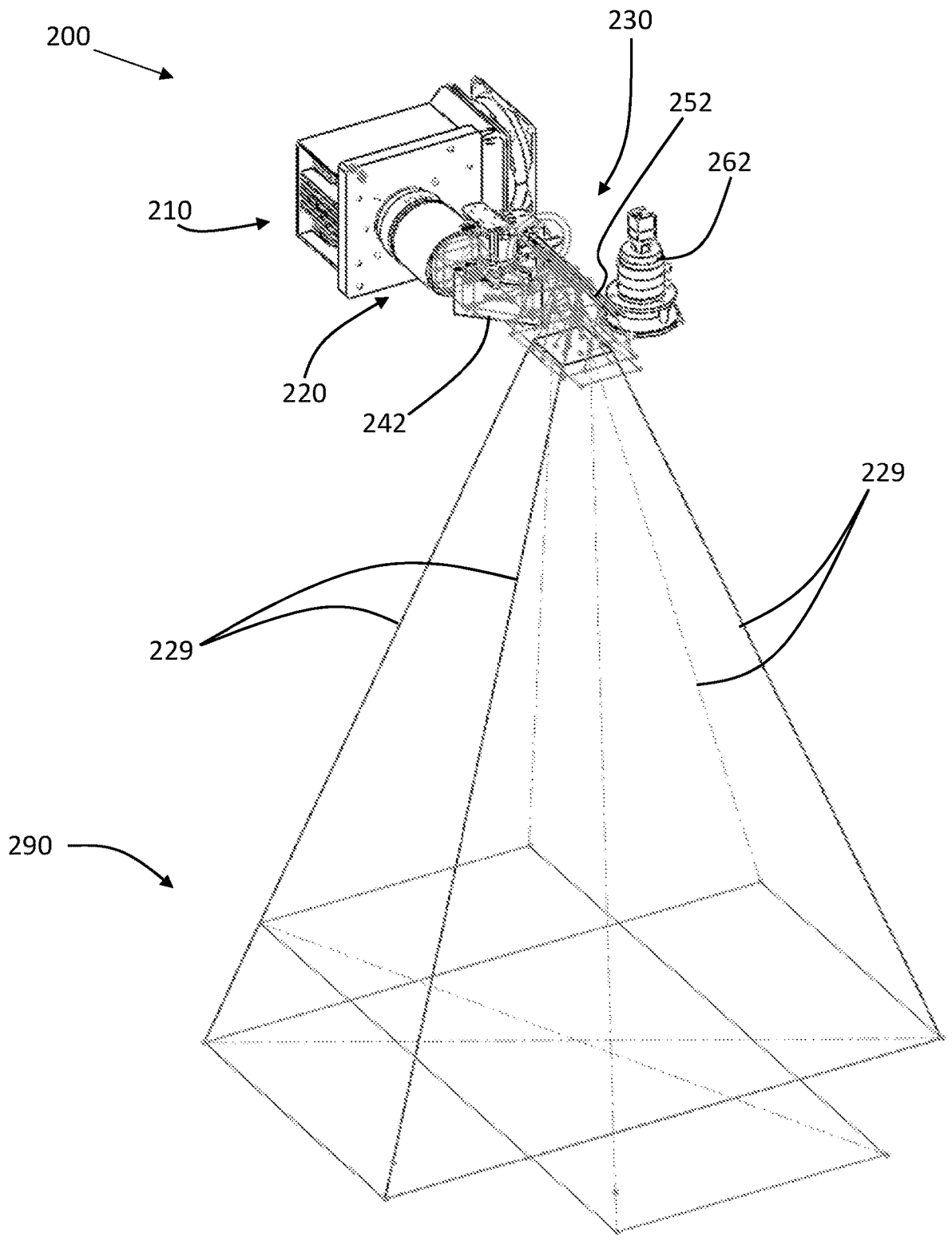
FIG. 12 is a perspective view of the cultivator depicted in FIG. 8 and the target area of the cultivator according to one embodiment of the present disclosure.

In at least one example embodiment represented by FIGS. 9 and 10, at least one of the reflectors 242 and 252 is very large, which has advantages of being able to capture multiple individual light beams (such as all of the individual light beams produced by a number of the light sources 212, such as laser diodes) and/or a large/diffuse light beam that is being focused after emanating from the light generators. For example, in embodiments utilizing a very narrow single beam of light (such as that produced by a laser), the light beam emanating from the laser is very small and a small reflector may be used to redirect the laser beam. However, in embodiments of the light directing systems represented by FIGS. 9 and 10, the light emanating from aperture 229 is not a small beam of light, but is instead a number of individual lower power beams of light that occupy most of the aperture 229 and are focused to coalesce at the target, which can be a number of feet or a meter away from the focusing system 220, resulting in a group of light beams that arrive at the light directing system 230 (and in particular arrive at reflectors 242 and 252) that are separated and are at a lower intensity than needed to sufficiently damage the target plant (which has safety benefits since the group of light beams are much less dangerous for a user when separated than when they are brought together at the target). In example embodiments, one or both of the reflectors 242 and 252 are approximately 3 square inches or larger (for example, 1.5× 2.5 inches or larger), while in another example embodiment one or both of the reflectors 242 and 252 are 6 square inches or larger (for example, 2×3 inches or larger). By comparison, mirrors that are 1×1 inches are generally considered to be too large for typical systems that utilize mirrors to direct laser light.

In order to direct the light beam 229 at targets, the light directing system 230 of embodiments of the present disclosure are capable of precisely moving the large reflectors. At least one embodiment of light directing system 230 utilizes motion systems that produce high torque and are capable of rapid and accurate (within approximately 1 mm or ±500 micrometers ($\mu$m)) positioning in order to target the desired biological material. In some embodiments the one or more galvanometers accelerate at 3,000 radians per second squared (rad/s 2) and travel at 3.5 rad/s, while in other embodiments the galvanometers accelerate at 30,000 rad/s 2 and travel at 35 rad/s, while in still other embodiments the galvanometers accelerate at 300,000 rad/s 2 and travel at 350 rad/s. In embodiments of the present disclosure, the encoders in the galvanometer provide an angular feedback of approximately 25 microradians for positioning of the one or more relatively large reflectors. In one example embodiment, motion systems 244 and/or 254 include a galvanometer that is directly connected to the large reflector 242 and/or 254, respectively.

By utilizing a direct-drive system (such as one in which the housing of the galvanometer rotates and the housing with its larger dimensions is connected to the reflector (as depicted in FIGS. 9 and 10), or in other embodiments one in which the output spindle of the galvanometer is rigidly connected to the reflector) between the galvanometer and the reflective surface, fast and accurate positioning of the large reflective surface can be accomplished. Moreover, utilizing a mechanically straightforward direct-drive system with few moving parts provides for a system that is much less prone to failure and one in which the components are easy to access and/or replace if/when necessary.

Embodiments of motion system 244 and/or motion system 254 include a 3-phase galvanometer, which may be brushless and/or utilize field oriented control (FOC), and which allows for the using of higher pole count electric motors than more traditional 4 pole galvanometer motors, which can provide significantly greater torque and are generally capable of large angles of rotation, and in some embodiments unlimited angles of rotation. However, such systems can have difficulties with torque ripple and/or cogging that can occur at each pole. In order to compensate for these issues, embodiments of the present disclosure utilize a high speed servo loop (approximately 50 kHz) with position encoders mounted to the galvanometer motor.

Target tracking system 260 includes a target sensor 262 (one example of a detector 120, which may be a camera, such as a RGB camera) and a processor 264, which may be physically and/or wirelessly connected to one another. The target sensor 262, which typically includes object/target detection and tracking, gathers information (for example, image information) from its field of view, which may be larger than the target field 290, and outputs information to the processor 264. The processor 264 manipulates the information from the target sensor 262 to determine the location of targets. The processor 264 outputs information (via wired and/or wireless pathways) related to the location of targets to the light directing system 230, which in turn directs the light toward desired targets.

Typical target sensors 262 are cameras that output image information in frames, typically at a frame rate that is from 15 to 30 frames per second (fps). While more expensive cameras are available with faster frame rates, embodiments of the cultivator 200 predict where a target will be between frames when there is no target location information being supplied, which allows for use of target sensors with slower frame rates. To predict where the target will be in between frames of the target sensor 262, embodiments utilize target velocity sensors to track the speed of the targets and/or the speed of the ground as the cultivator 200 moves. Some embodiments utilize optical tracking systems (similar to how an optical mouse for a computer tracks motion) to determine ground speed, while further embodiments utilize a wheel placed on the ground, while still further embodiments utilize navigational aids such as the Global Positioning System (GPS). Still further embodiments utilize the target detector and the tracking of the target to determine the target velocity.

Advantages to embodiments of the present disclosure that are capable of actively locating, tracking and illuminating targets include the ability to use a system frame/chassis that is less rigid and lighter than other systems since relative motion between the target tracking system and the rest of the system can be rendered irrelevant.

Cultivator 200 can obtain its power from a variety of power sources, such as the power sources associated with power source 110 discussed above.

Some embodiments of the present disclosure move the light beam over the location of the target plant 293 two or more times, which can enhance the damage imparted to the target plant 293. For example, FIGS. 13 and 14 include illustrations of light beam pathways 291 that approach the location of a target plant 293 along a light beam approach path 292 and depart the location of a target plant 293 along a light beam departure path 294.

Figure 13:
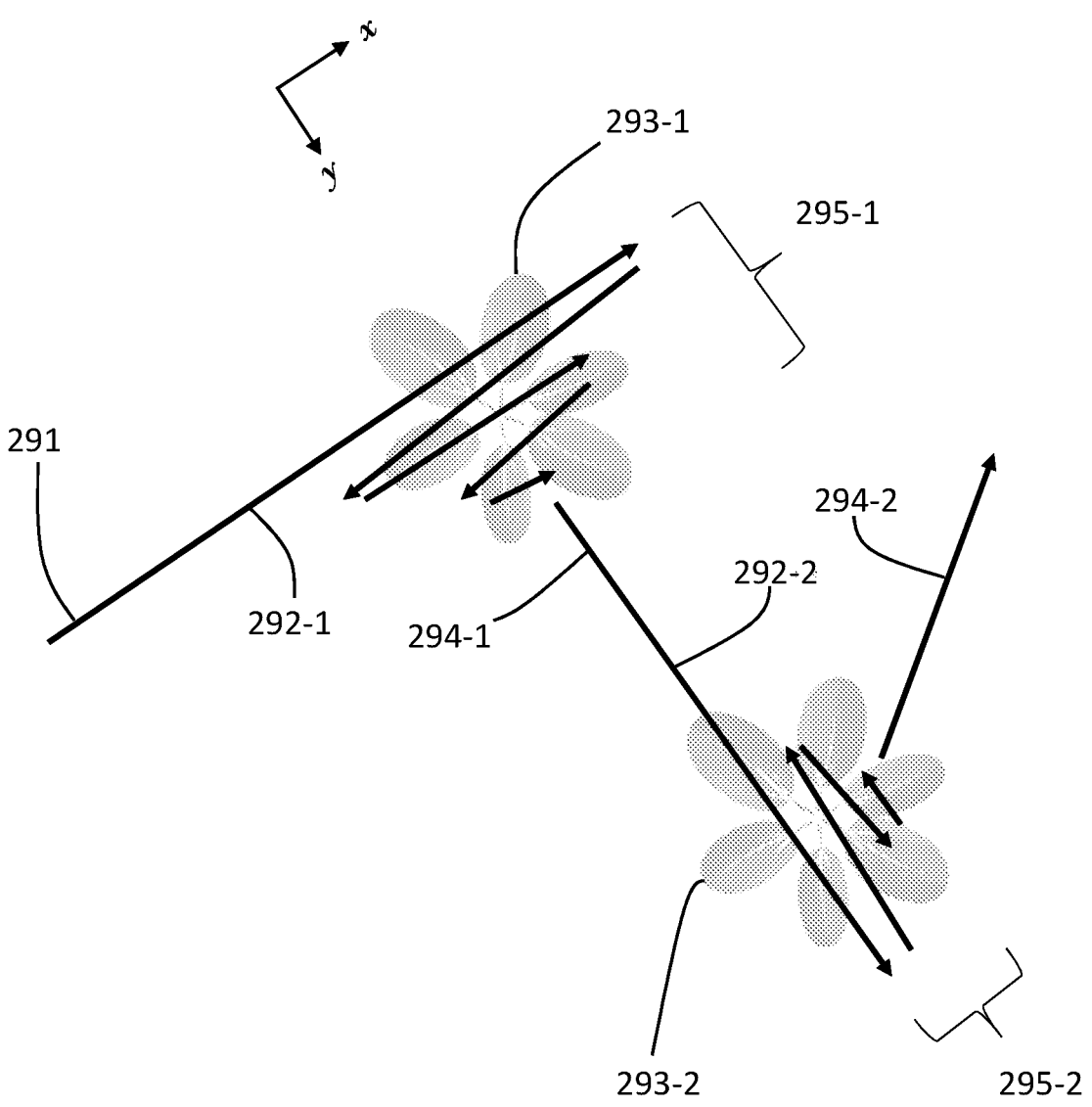
FIG. 13 is an illustration of a light beam pathway moving over target plants according to one embodiment of the present disclosure.

Depicted in FIG. 13 is an example light beam pathway 291 that approaches the location of a first target plant 293-1 (which may be determined by a target plant detector 120) along a light beam approach path 292-1. After intersecting with the location of the first target plant 293-1 the light beam pathway 291 crosses over the location of the first target plant 293-1 numerous times (two or more) before departing the location of the first target plant 293-1 along a departure path 294-1. The light beam pathway 291 then approaches the location of a second target plant 293-2 (which may be determined by a target plant detector 120) along a light beam approach path 292-2, which may be a continuation of light beam departure path 294-1 or may be in a different direction from light beam departure path 294-1. After intersecting with the location of the second target plant 293-1 the light beam pathway 291 crosses over the location of the second target plant 293-1 numerous (two or more) times before departing the location of the second target plant 293-2 along a departure path 294-2.

While the location of a target plant 293 may be determined by a target plant detector, such as detector 120. to be an area (or zone) in which at least a portion of the target plant resides, in some embodiments the location of the target plant area is approximately equal to the area of the target plant 293 as viewed from the cultivator 200, such as the area as viewed from the light generator (for example, light generating system 210), the light beam directing member (for example, light beam directing system 230), or the target detector (for example, detector 120). However, in some embodiments the location of a target plant 293 is determined to be an area much smaller than the size of the plant as viewed from the cultivator 200, such as the size the stem as viewed from the cultivator 200 or a point. Some embodiments utilize controls that cause the light beam to pass over the location of the target plant 293 two or more times, which can enhance the damage imparted to the target plant 293.

In some embodiments the multiple crossover pathway is created by a light beam directing member (for example, light beam directing system 230) that is designed to be underdamped resulting in the light beam directing system 230 overshooting a commanded change in motion, such as a commanded stop, dwell, or direction change. In these example embodiments the damping level is noticeably underdamped resulting in two or more overshoots and causing a ringing (oscillating) after receiving a commanded change in motion. The result is a light beam pathway that intersects multiple locations on the same target plant 293. In addition to imparting additional stress to the target plant, utilization of beam overshoot and ringing can enable faster multi-pass processing since the light beam directing system does not have to slow down as it approaches a target plant and the level of ringing can be controlled to achieve the desired effect.

The number of times the light beam pathway 291 overshoots the location of the target plant 293 can be varied based on the level of underdamping designed into the light beam directing system 230. The number of overshoots will also depend on the damping ratio, resonant frequency, and how long the light beam is allowed to dwell on a target plant before moving to the next target plant. Some embodiments utilize a combination of underdamping and dwell time that results in a maximum of 5 overshoots, while other embodiments utilize a combination of underdamping and dwell time that results in a maximum of 3 overshoots. The damping ratio can be dynamically changed by adjusting the motion control parameters.

The distance that the light beam pathway 291 overshoots the location of the target plant 293 as determined by the cultivator 200 can be varied with changes to the light directing system. In some embodiments, the distance that the light beam pathway 291 overshoots the location of the target plant 293 is approximately one-half the size of the location of target plant 293-1 as viewed from the cultivator 300, such as one-half the size of the location of the target plant 293-1 as viewed from the light generator (for example, light generating system 210), the light beam directing member (for example, light beam directing system 230), or the target detector (for example, detector 120).

In some embodiments, the average size of the target plants 293 as viewed from the light generator or the light beam directing member is known or estimated, and the distance of the first overshoot may be selected to equal a certain distance, which may be equal to approximately one-half, one-third or one-quarter the average size of the target plants 293 as viewed from the light generator or the light beam directing member.

In some embodiments the light beam pathway 291 intersects the plant at a off-center location, i.e., a location that does not intersect the center of the target plant location area as determined by the target plant detector 120, such as the location depicted in FIG. 13. In other embodiments the light beam pathway 291 intersects the center of the target plant location area, which can also serve as an approximate location of the target plant's stem.

In some embodiments the ringing results in the light beam moving over different parts of the plant, an example of which is depicted in FIG. 13. In this example the ringing includes a velocity component that is perpendicular to the light beam approach path 292-1. This perpendicular velocity component can be a natural result of ringing in the light beam directing system 230 that occurs in both the direction of travel (e.g., the approach path 292-1, which in FIG. 13 is in the x-direction) and perpendicular to the direction of travel (e.g., in the y-direction in FIG. 13) when the light beam directing system 230 implements a change in motion, or the perpendicular velocity component can occur in embodiments where a small perpendicular velocity component (a velocity in the cross-path direction (y-direction) for approach path 292-1) is commanded with the commanded change in motion. In FIG. 13, the perpendicular velocity component occurring in the crossover zone 295-1 is in a single direction (the positive y-direction in FIG. 13) resulting in a zigzag pattern. A similar zigzag pattern appears in the second crossover zone 295-2 associated with the second target plant 293-2. In other embodiments the perpendicular velocity component alternates direction (such as between the positive y-direction and the negative y-direction in FIG. 13) resulting in a crossover pathway that appears on both sides of the approach path 292-1. In still further embodiment, there is no perpendicular velocity component and the crossover pathway retraces the approach path 292-1.

In addition to potentially enhancing the damage imparted to the target plant, embodiments that overshoot a commanded change in motion can also help reduce stress on components of the cultivator. For example, in embodiments utilizing large reflectors (for example, reflectors 242 and 252 that are larger than 1, 3 or 6 square inches) that are moved by galvanometers (for example, galvanometers 244 and 254), the overshooting can result in lower impulse forces being imparted to the connection between the large reflectors and the galvanometers since the start/stop sequences be less abrupt, thereby reducing wear and tear on the system.

In other embodiments the light beam directing systems are more damped and more closely controlled than the noticeably underdamped light beam directing systems described above. While overshoots may occur in the more closely controlled light beam directing systems, typical embodiments of the more closely controlled light beam directing systems do not overshoot more than once, and some embodiments are critically damped and do not overshoot a commanded change in motion. In these embodiments the exact pathway of the light beam 291 is more closely controlled resulting in different ways in which the damage to the target plant can be enhanced.

Figure 14:
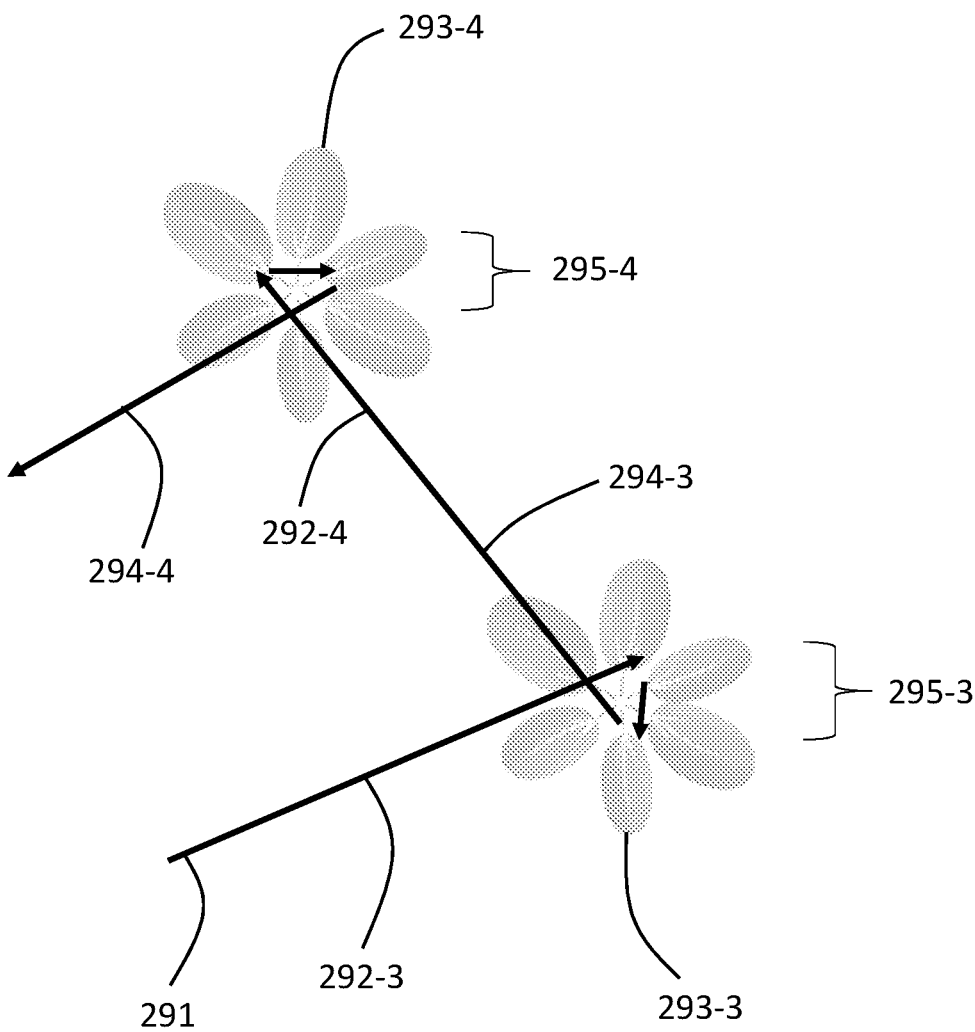
FIG. 14 is an illustration of a light beam pathway moving over target plants according to another embodiment of the present disclosure.

An example pathway commanded by embodiments of the present disclosure that more closely control the light beam directing systems to enhance damage to the target plant 293 is depicted in FIG. 14. In this embodiment the pathway remains close to central stem and the pathway remain close to the stem and does not extend very far (if at all) past the base of each leaf.

In FIG. 14 the light beam pathway 291 approaches the location of a first target plant 293-3 (which again may be determined by a target plant detector 120) along a light beam approach path 292-3. After intersecting with the location of the first target plant 293-3 the light beam pathway 291 passes off-center past the central stem of the first target plant 293-3, is commanded to change direction back toward the central stem and offset to the side of the central stem away from the second target plant 293-4, passes off-center past the central stem a second time, and is then commanded toward the second target plant 293-4 along light beam departure path 294-3. The light beam pathway 291 then approaches the location of a second target plant 293-4 along a light beam approach path 292-4, which may be a continuation of light beam departure path 294-3 or may be in a different direction from light beam departure path 294-3. After intersecting with the location of the second target plant 293-4 the light beam pathway 291 passes off-center past the central stem of the second target plant 293-4, is commanded to change direction back toward the central stem and offset to the side of the central stem away from the next target plant, passes off-center past the central stem of the second target plant 293-4 a second time, and is then commanded toward another target plant along the light beam departure path 294-4.

The pathway depicted in FIG. 14 is capable of applying a higher amount of energy to the meristem regions (which are typically in and around the main stem) and to the base of each leaf, which can have additional benefits in causing the leaves to droop and get stuck in wet soil (mud) when the procedure is conducted in wet soil, such as after a rain shower. Cultivators using wavelengths that are absorbed by water are generally unable to take advantage of this method of injuring a wet plant so that it later dies, which can result in such cultivators being unable to operate after a rain shower or when there is dew on the plants.

In making the triangular patterns depicted in FIG. 14 the light beam directing system changes direction of the light beam twice while the light beam is aimed in the target plant location area: first after passing the central stem (which may be approximated by the center of the target plant location area as determined by the target plant detector) then a second time after again passing the central stem, the second being to a direction that will move the light beam to the next target plant. Although the pathways are triangularly shaped near the main stem, other embodiments create pathways that are square and star shaped near the main stem.

Since the distance the light beam pathway 291 extends past each central stem of the target plants 293-3 and 293-4 in FIG. 14 is less than the distance the light beam pathway 291 extends past each central stem of the target plants 293-1 and 293-2 in FIG. 13, the crossover zones 295-3 and 295-4 in FIG. 14 are smaller than the crossover zones 295-1 and 295-2 in FIG. 13.

Figure 15:
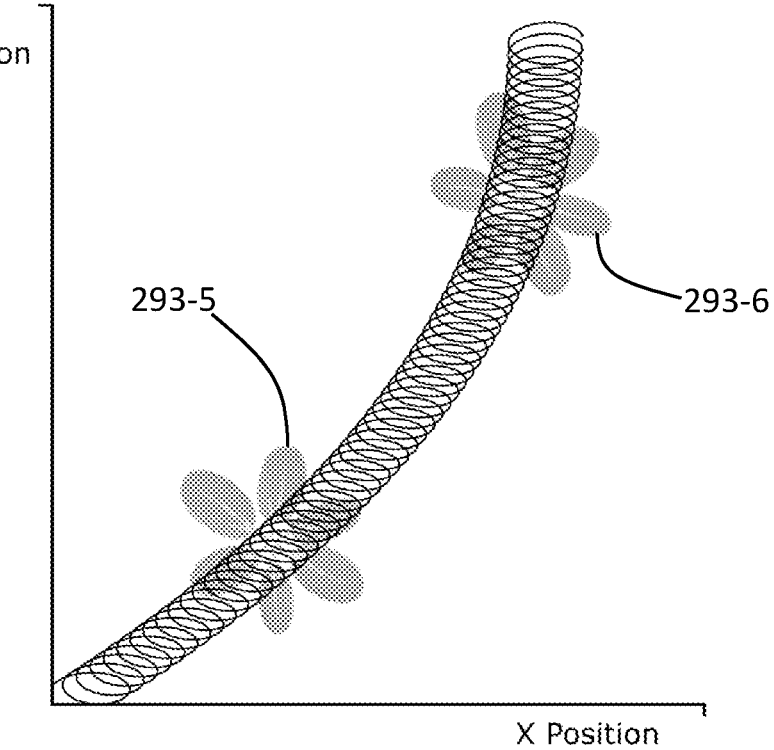
FIG. 15 is an illustration of a light beam pathway moving over target plants according to still another embodiment of the present disclosure.

Depicted in FIG. 15 is a an example light beam pathway created by overlaying (superposing) a motion pattern on top of the central light beam pathway as the light beam is moved from target plant to target plant. In this example the central light beam pathway is controlled in a more fluid motion as the central light beam pathway extends from the origin (0,0) of FIG. 15 through target plants 293-5 and 293-6, resulting in less abrupt directional changes of the underlying pathway than the directional changes depicted in FIGS. 13 and 14. However, in other embodiments the underlying light beam pathway upon which the motion is overlaid is similar to the light beam pathways depicted in FIGS. 13 and 14.

Figure 16:
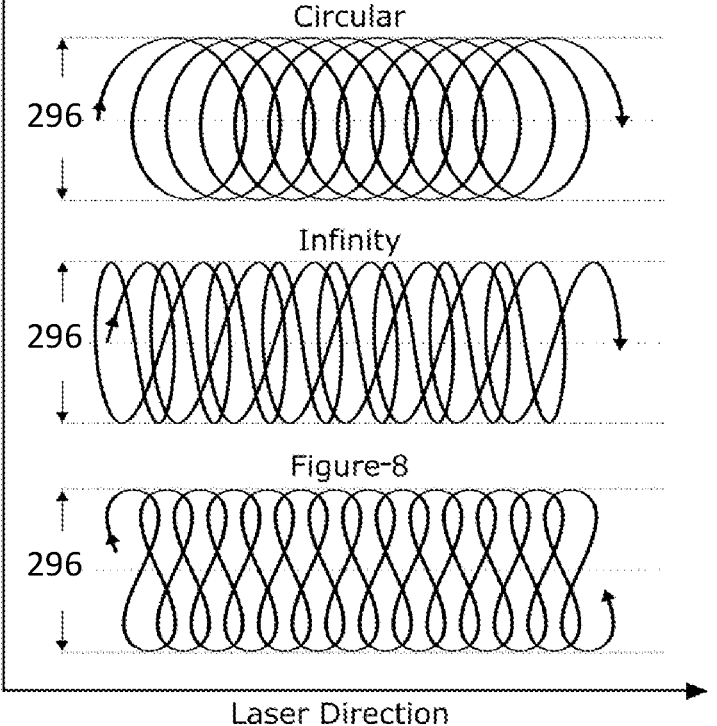
FIG. 16 is an illustration of different example shapes that can be superposed on the primary light beam pathway according to embodiments of the present disclosure.

Depicted in FIG. 16 are example overlaying motion shapes (circular, infinity shaped (horizontally oriented figure-8), and figure-8) and a representation of the light beam pathway that is produced when the depicted motion shapes of an wobble amplitude 296 are overlaid on a central (underlying) pathway. In some embodiments this overlaying motion is generated with a reflector that is smaller than reflectors 242 and 252, and is connected to a fast steering galvanometer that moves quickly over small angles to generate the small overlay patterns. In the illustrated examples the speed of the overlaying motion is significantly greater than the speed the light beam travels along the central underlying pathway resulting in relatively tight spiral patterns, i.e., the distance between adjacent shapes is small. In other embodiments the difference in speed between the overlaying motion and the speed the light beam travels along the central underlying pathway can be varied to tighten or loosen the pattern. This spiral motion spreads the light energy over a larger area and results in a dynamically shaped light beam. In some embodiments the dynamic shaping of the light beam is further enhanced by varying the shape and/or speed that the overlaying shape is created. This dynamic shaping can further enhance the ability to precisely control the energy being imparted to the target plant. For example, it is possible to apply a uniform energy over the entire plant location area or to concentrate the energy in vital locations, such as the meristem.

In some embodiments the size of the overlaying shape is approximately the size of the target plant location area, while in other embodiments the size of the overlaying shape is approximately the size of the area within the base of the leaves, while in still further embodiments the size of the overlaying shape is approximately the size of the central plant stem.

In certain embodiments the overlaying motion is implemented when the light beam directing system is aiming the light beam at a target plant location area and not implemented when the light beam directing system is aiming the light beam at locations that are not in the target plant location, e.g., when moving from target plant location to target plant location. In some embodiments the underlying motion of the central pathway is zero when the light beam is aimed at the target plant location resulting in the light beam retracing the same pathway over the target plant location and enhancing the damage imparted to the plant.

An option of the example embodiments described herein is to have the light generating systems continuously produce a light beam, which results in the light beam remaining on as the light beam is moved from target plant to target plant. Another option is to have the light generating system intermittently produce light, which can result in the light beam pulsing at regular intervals or can result in the light beam being turned off when the light beam directing system is repositioning the commanded light beam position (the position where the light beam would be if the light generating system and light beam were "on") between target plants.

As used herein, the term "target plant location area" and similar terms are intended to indicate the location of the plant as determined by the target plant detector. However, there may be descriptions of the light beam being on the "target plant." It should be understood that the light directing system typically directs the light beam to a location that is determined by the target plant detector which, when the target plant detector detects the precise location of the target plant, results in the light beam being precisely on the target plant.

Figure 17:
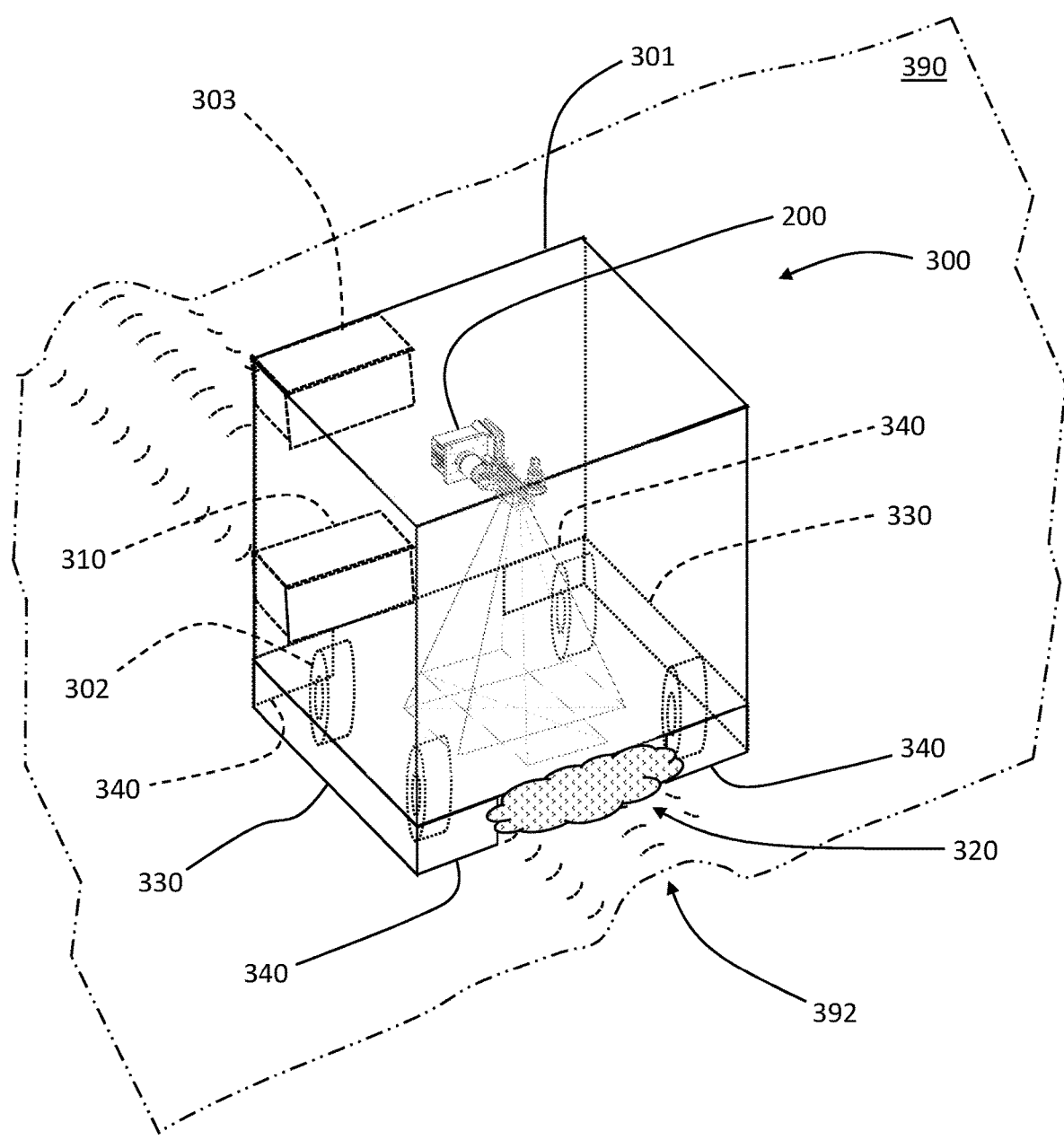
FIG. 17 is a perspective view of a cultivator according to yet another embodiment of the present disclosure

Depicted in FIG. 17 is a cultivator 300 according to yet another embodiment of the present disclosure. Cultivator 300 includes a housing 301, a suspension system 302 that suspends the cultivator 300 above (and may also propel cultivator 300 through) an agricultural field 390, a target plant detector 303, a light energy generation and directing system (depicted as cultivator 200 in this example embodiment), one or more optional side 330 panels, one or more optional front/rear panels 340, and an optional vapor cloud generator 310. In the example embodiment described below the "field 390" is generally depicted in FIG. 17 as an outdoor field of soil/dirt. However, the illustration and description of the embodiments described herein (including embodiments related to cultivator 100, cultivator 200 and cultivator 300) are not so limited and embodiments of the present disclosure (including embodiments related to cultivator 100, cultivator 200 and cultivator 300) are capable of operating in other types of "fields 390" such as fields of plants in indoor growing facilities.

Agricultural fields 390 commonly arrange desirable plants in rows of plant beds 392. During operation the cultivator 300 will need to move up and down the rows as it damages target plants. Frequently the rows of plant beds 392 will be raised, as depicted in FIG. 17, and the cultivator 300 will need to operate in and around these raised plant beds. To do so, the suspension system 302 will typically contact the agricultural field 390 in the furrows adjacent the raised plant beds 392 and suspend the housing 301 sufficiently high to allow the raised plant beds to pass underneath the housing 301. However, since the size and shape of the raised plant beds 392 typically vary from field to field, and can even vary significantly within the same field, gaps will tend to appear between the soil and the housing 301 of cultivator 300. In embodiments where the light beams are at a wavelength that can be harmful (for example, wavelengths that can damage a person's eye, such as high-powered blue laser light), harmful light can escape in these gaps underneath the housing 301 and above the soil of the agricultural field 390, especially in agricultural fields 390 where the soil contains reflective minerals such as quartz.

In order to reduce (if not eliminate) the gaps between the housing 301 and the soil and thereby reduce (or eliminate) the escape of harmful light, the cultivator 300 can optionally include panels that extend below the housing 301 and/or extend below the raised plant bed 392. Depicted in FIG. 17 are example side panels 330 and front/rear panels 340 that inhibit light from escaping from underneath cultivator 300. In the illustrated example there are two side panels 330 (one on each side of the housing 301) and four front/rear panels 340 (two on either side of the raised plant bed 392 in the front of the housing 301, and two on either side of the raised plant bed 392 in the rear of the housing). The panels are constructed to prevent the light generated by cultivator 300 (an in particular the light generated by the cultivator 200 portion of cultivator 300 in FIG. 17) from passing through the panel. In at least one embodiment the panels are manufactured from sheet metal or other similar material, which may also be flexible. In some embodiments the panels extend below the axles of the wheels in the suspension system 302, and in further embodiments the panels include features (which may be added to the panels or formed integrally with the panels) that allow the panels 330 and/or 340 to contact the soil, such as flexible portions that will flex and bend with the changing soil level and texture.

Even in embodiments utilizing the side 330 and front/rear 340 panels, it may still be possible for light to nevertheless escape from cultivator 300. To address this possibility some embodiments of cultivator 300 include a vapor generator 310 that creates a vapor and/or aerosol cloud (e.g., vapor cloud 320) in locations where light may escape. The example location where the vapor cloud 320 is formed in FIG. 17 is in the front of cultivator 300 in the region surrounding the raised plant bed 392. Another common location where the vapor cloud 320 can be formed is in a similar region surrounding the raised plant bed 392 in the rear of the cultivator 300, which is not depicted in FIG. 17 in order to reduce clutter.

In some embodiments, such as those using water vapor, the vapor cloud scatters and/or attenuates the intensity of light that may escape from the cultivator 300 (such as form underneath the cultivator 300), rendering the escaping light safe. In some embodiments the size of the vapor particles generated are similar to or larger than the wavelength of the light, resulting in elastic Mie scattering, which is particularly beneficial in embodiments utilizing "blue" laser light to injure the target plants. The scattering redirects the light, spreading the laser energy over a larger solid angle (steradians) and decreases the beam quality factor, which limits the degree to which the beam can be focused and reduces the energy that can be inadvertently focused, for example, on a user's eye.

In still other embodiments the vapor/aerosol cloud absorbs the energy of the light that may escape. When the light is of a wavelength that is absorbed by water, the presence of the water vapor cloud alone will absorb energy from and reduce the intensity of the escaping light. However, in embodiments where the light is at wavelengths that are not readily absorbed by water, such as "blue" laser light, the water can include one or more additives that enhance the ability of the vapor cloud to attenuate the intensity of any light that may escape, such as by absorbing energy from the escaping light. For example, dispersing and/or suspending dyes, pigments or particles in the water can increase absorption of the light energy by the vapor cloud. In one example embodiment chlorophyll is added to the fluid/water, which greatly enhances the ability of the vapor/aerosol cloud to attenuate (for example, absorb) energy from the escaping light. In another example embodiment nanoparticles (for example, nano dots and carbon dots) are suspended in the fluid/water, which can greatly enhance the ability of the vapor/aerosol cloud to attenuate energy from the escaping light.

Example devices used to create the vapor cloud 320 include piezoelectric ceramic disks, ultrasonic transducers, evaporators, sprayers (including electrosprayers), nebulizers, and atomizing water vapor generators. The vapor clouds 320 can be formed at the gaps in the plant bed entry or exit tunnel volumes (the regions between the front/rear panels 340 where gaps may exist between the cultivator 300 and the plant bed 392) and can significantly improve the safety of the laser light that may escape from cultivator 300 (for example, by scattering and/or diffusion), such as light escaping between the bottom of cultivator 300 and the soil. Certain embodiments utilize a 25 Watt piezoelectric disk to generate a water vapor cloud 320, which in some embodiments uses approximately 2¼ gallons (8.5 liters) of water per hour to generate an appropriate vapor cloud, such as in the gaps existing in the plant bed entry and exit tunnel volumes at the front or rear of the cultivator 300. In embodiments that generate vapor clouds in the front and back gaps existing in the plant bed entry and exit tunnel volumes, the amount of water to generate the water vapor clouds will be approximately double.

Embodiments of the cultivator 300 convert a maximum of 7 gallons (26 liters) of fluid (e.g., water) per hour to vapor clouds, while additional embodiments convert a maximum of 4.5 gallons (17 liters) of fluid (e.g., water) per hour to vapor clouds, while still further embodiments convert approximately 2.25 gallons (8.5 liters) of fluid (e.g., water) per hour to vapor clouds.

Embodiments of cultivator 300 can also include fluid tanks (e.g., water tanks) that are supported by the cultivator with the fluid in the fluid tanks being used to generate one or more vapor clouds. The fluid tanks (e.g., water tanks) can store sufficient water to operate the cultivator 300 and generate sufficient vapor clouds 320 for continuous operations as described herein for up to 6, 10 or 12 hours. Even when the weight of the fluid (e.g., water) is added to the overall weight of the cultivator 300, these embodiments can still be sufficiently light to operate in wet agricultural fields, such as after an inch of rain has fallen onto the agricultural field.

Embodiments of the cultivator 300 include one or more fluid tanks (e.g., water tanks) that hold a maximum of 600 pounds (approximately 70 gallons or 270 liters) of fluid (e.g., water), while additional embodiments include one or more fluid tanks (e.g., water tanks) that hold a maximum of 400 pounds (approximately 50 gallons or 190 liters) of fluid (e.g., water), and still further embodiments include one or more fluid tanks (e.g., water tanks) that hold a maximum of 200 pounds (approximately 24 gallons or 90 liters) of fluid (e.g., water).

Embodiments of housing 301 can also include body panel joints that are lapped and/or labyrinthine (i.e., not butt joints) to inhibit/prevent laser light from escaping above and surrounding the cultivator 300.

Various aspects of different embodiments of the present disclosure are expressed in paragraphs X1, X2, X3, X4 and X5 as follows:

X1. One embodiment of the present disclosure includes a cultivator, comprising: a first stress energy generator configured and adapted to emit energy intended to stress undesirable plant material; and means for directing the energy emitting from the first stress energy generator to reach the undesirable plant material.

X2. Another embodiment of the present disclosure includes a cultivator, comprising: a light emitter (which may exclusively produce blue light), a focusing device receiving light from the light emitter and focusing the light at a focus distance from the focusing device; and a light director positioned a distance from the focusing device and receiving light from the focusing device, the light director sequentially redirecting the light toward multiple target plants; wherein the focus distance is greater than the distance from the focusing device to the light director.

X3. Still another embodiment of the present disclosure includes a cultivator, comprising: means for generating light in two or more light pathways (wherein the generated light may be exclusively be blue light); optional means for focusing light propagating in the two or more light pathways at a focus distance; and optional means for directing light propagating in the two or more pathways from the focusing means toward multiple target plants; wherein in embodiments with both the optional means for focusing light and the optional means for directing light, the focus distance is greater than the distance from the focusing means to the light directing means.

X4. Yet a further embodiment of the present disclosure includes a cultivator for injuring target plants, comprising: a target plant detector configured and adapted to detect the location of one or more target plants; a light beam generator configured and adapted to generate a light beam in a wavelength that injures the one or more target plants; a light beam directing member configured and adapted to aim the light beam at each of the one or more target plants and change the direction of the light beam at least twice while the light beam is aimed at each of the one or more target plants.

X5. Still a further embodiment of the present disclosure includes an agricultural cultivator, comprising: a light emitter configured and adapted to emit light that will damage one or more target plants and is considered to pose a level of harm to operators of the agricultural cultivator; a light director configured and adapted to direct the light from the light emitter to one or more target plants; a housing surrounding the light emitter and positioned above a support surface, wherein the housing is configured and adapted to prevent light emitted by the light emitter from passing through the housing, the position of the housing above a support surface forms one or more gaps between the housing and the support surface, and light from the light emitter is able to pass through the gaps between the housing and the support surface; and a vapor generator configured and adapted to generate a vapor cloud at the location of the one or more gaps, wherein the vapor cloud diminishes the level of harm of the escaping light.

Yet other embodiments include the features described in any of the previous statements X1, X2, X3, X4 or X5, as combined with (i) one or more of the previous statements X1, X2, X3, X4 or X5, (ii) one or more of the following aspects, or (iii) one or more of the previous statements X1, X2, X3, X4 or X5 and one or more of the following aspects:

Further comprising means for determining a first location of undesirable plant material.

Wherein said means for directing includes means for directing the energy emitting from the first stress energy generator to reach the first location of undesirable plant material.

Wherein said means for determining a first location of undesirable plant material includes an electronic sensor configured and adapted to sense a first location of undesirable plant material.

Wherein the first location of undesirable plant material is a plant leaf.

Wherein the first location of undesirable plant material is a plant stem.

Wherein the first location of undesirable plant material is a terminal bud.

Wherein the first stress energy generator includes a radiation source configured and adapted to emit radiation.

Wherein said means for directing includes an electromechanical aiming device controlling the direction the energy emitting from the first stress energy generator propagates.

Wherein the first stress energy generator generates energy with an intensity on the order of 1 J/cm$^2$ (one Joule per square centimeter).

Wherein the first stress energy generator is a first laser and the light discharged by the first laser has a wavelength of at least 300 nm and at most 750 nm.

Wherein the first stress energy generator is a first laser and the light discharged by the first laser has a wavelength of at least 435 nm and at most 455 nm.

Wherein the first laser generates a beam with a high intensity portion near the center of the beam and a lower intensity portion around the periphery of the beam.

Wherein the first laser generates at least two beams, each beam with a high intensity portion near the center of the beam and a lower intensity portion around the periphery of the beam.

Wherein the first stress energy generator emits energy in a direction and the radiation has a Gaussian profile around the direction.

Wherein the first stress energy generator generates heat.

Wherein the first stress energy generator generates mechanical stress that is applied to the undesirable plant material.

Wherein the first stress energy generator moves air.

Further comprising a second stress energy generator configured and adapted to emit energy intended to stress undesirable plant material.

Wherein said means for directing includes means for directing the energy emitting from the second stress energy generator to reach the undesirable plant material.

Further comprising means for determining a second location of undesirable plant material.

Wherein said means for directing includes means for directing the energy emitting from the second stress energy generator to reach the first location of undesirable plant material.

Wherein said means for directing includes means for directing the energy emitting from the second stress energy generator to reach the second location of undesirable plant material.

Wherein said means for determining a second location of undesirable plant material includes an electronic sensor configured and adapted to sense a second location of undesirable plant material.

Wherein the second location of undesirable plant material is a plant leaf.

Wherein the second location of undesirable plant material is a plant stem.

Wherein the second location of undesirable plant material is a terminal bud.

Wherein the second stress energy generator includes a radiation source configured and adapted to emit radiation.

Wherein said means for directing includes an electromechanical aiming device controlling the direction the energy emitting from the second stress energy generator propagates.

Wherein the second stress energy generator generates energy with an intensity on the order of 1 J/cm$^2$ (one Joule per square centimeter).

Wherein the second stress energy generator is a second laser and the light discharged by the second laser has a wavelength of at least 800 nm and at most 10,600 nm.

Wherein the second laser generates a beam with a high intensity portion near the center of the beam and a lower intensity portion around the periphery of the beam.

Wherein the second laser generates at least two beams, each beam with a high intensity portion near the center of the beam and a lower intensity portion around the periphery of the beam.

Wherein the second stress energy generator emits energy in a direction and the radiation has a Gaussian profile around the direction.

Wherein the second stress energy generator generates heat.

Wherein the second stress energy generator generates mechanical stress that is applied to the undesirable plant material.

Wherein the second stress energy generator moves air.

Wherein the light emitter includes a laser.

Wherein the light emitter includes an array of laser diodes.

A first lens receiving light from the array of laser diodes and causing the light pathways from the laser diodes to diverge.

A second lens receiving light from the first lens and causing the light pathways to converge.

Wherein the first lens causes the light pathways to expand.

Wherein at least one of the first lens and the second lens is a convex lens.

Wherein both of the first lens and the second lens are convex lenses.

Wherein the light pathways form a spot size at the focus distance of approximately 1 cm$^2$.

Wherein a single light pathway forms a spot size at the focus distance of approximately 1 cm$^2$.

Wherein the power intensity of the light in the spot is 500-900 W/cm$^2$.

Wherein the light emitter emits light at one or more wavelengths from 430 nm to 480 nm.

Wherein the light emitter emits light exclusively in in the range of 430 to 480 nm.

Wherein the focusing device expands the pathway in which the light travels.

Wherein the light director includes two reflectors.

Wherein the light director includes two motors.

Wherein each motor includes a rotator that rotates about a rotation axis, and each reflector is connected to a rotator.

Wherein the rotator of each motor is a motor housing.

Wherein the reflective area of each reflector is at least 3 square inches.

A target tracking system configured to identify and track the target biological material.

Wherein the light director receives information from the target tracking system to maintain the light on the target plant for 100-200 ms.

Wherein the light emitting means includes an array of laser diodes.

Wherein the light focusing means includes a first lens receiving light from the array of laser diodes and causing the light pathways from the laser diodes to diverge.

Wherein the light focusing means includes a first lens receiving light from the array of laser diodes and causing the light pathways from the laser diodes to individually expand.

Wherein the light focusing means includes a second lens receiving light from the first lens and causing the light pathways to converge.

Wherein the change in direction of the light beam results in the light beam tracing a triangular pattern over each of the target plants.

Wherein the change in direction of the light beam results in the light beam tracing a star shaped pattern over each of the target plants.

Wherein the change in direction of the light beam results in the light beam tracing a zigzag pattern over each of the target plants.

Wherein the light beam directing member is configured with a level of underdamping resulting in the light beam overshooting the location of each of the one or more target plants at least three times.

Wherein the one or more target plants define an average target plant size and the distance of the light beam overshooting the location of each of the one or more target plants at least three times is greater than or equal to approximately one-quarter the average target plant size.

Wherein the vapor generator generates a water vapor cloud.

Wherein the housing is configured to carry a maximum of 600 pounds of water stored on one or more water tanks.

Wherein the vapor generator converts 4.5 gallons of water to water vapor per hour of operation of the vapor generator.

Wherein the vapor generator generates a water vapor cloud that includes chlorophyll.

Wherein the vapor generator generates a water vapor cloud that includes a light intensity attenuating additive configured and adapted to attenuate the intensity of light from the light emitter.

Wherein the light intensity attenuating additive is chlorophyll.

Wherein the vapor generator includes a component selected from the list consisting of a piezoelectric ceramic disk, an ultrasonic transducer, an evaporator, a sprayer, an electrosprayer, a nebulizer and an atomizing water vapor generator.

Reference systems that may be used herein can refer generally to various directions (e.g., upper, lower, forward and rearward), which are merely offered to assist the reader in understanding the various embodiments of the disclosure and are not to be interpreted as limiting. Other reference systems may be used to describe various embodiments, such as referring to the direction of projectile movement as it exits the firearm as being up, down, rearward or any other direction.

While examples, one or more representative embodiments and specific forms of the disclosure have been illustrated and described in detail in the drawings and foregoing description, the same is to be considered as illustrative and not restrictive or limiting. The description of particular features in one embodiment does not imply that those particular features are necessarily limited to that one embodiment. Some or all of the features of one embodiment can be used or applied in combination with some or all of the features of other embodiments unless otherwise indicated. One or more exemplary embodiments have been shown and described. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

To clarify the use of and to hereby provide notice to the public, the phrases "at least one of A, B, . . . and N" or "at least one of A, B, . . . N, or combinations thereof" or "A, B, . . . and/or N" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. As one example, "A, B and/or C" indicates that all of the following are contemplated: "A alone," "B alone," "C alone," "A and B together," "A and C together," "B and C together," and "A, B and C together." If the order of the items matters, then the term "and/or" combines items that can be taken separately or together in any order. For example, "A, B and/or C" indicates that all of the following are contemplated: "A alone," "B alone," "C alone," "A and B together," "B and A together," "A and C together," "C and A together," "B and C together," "C and B together," "A, B and C together," "A, C and B together," "B, A and C together," "B, C and A together," "C, A and B together," and "C, B and A together."

ELEMENT NUMBERING

Table 1 includes element numbers and at least one word used to describe the member and/or feature represented by the element number. It is understood that none of the embodiments disclosed herein are limited to these descriptions, other words may be used in the description or claims to describe a similar member and/or feature, and these element numbers can be described by other words that would be understood by a person of ordinary skill reading and reviewing this disclosure in its entirety.

TABLE 1

| 100 | Cultivator |
|---|---|
| 110 | Power Source |
| 120 | Detector |
| 130 | Energy Emitter |
| 140 | Energy Beam |
| 200 | Cultivator |
| 210 | Light generating system |
| 211 | Cooling system (fan) |
| 212 | Light source |
| 214 | Array |
| 220 | Focusing system |
| 221 | Aperture |
| 222 | Lens |
| 224 | Lens |
| 226 | Distance |
| 227 | Distance |
| 229 | Light beam |
| 230 | Light directing system |
| 240 | Reflecting system |
| 242 | Reflector |
| 244 | Motion system |
| 249 | Rotation axis |
| 250 | Reflecting system |
| 252 | Reflector |
| 254 | Motion system |
| 259 | Rotation axis |
| 260 | Target tracking system |
| 262 | Target sensor |
| 264 | Processor |
| 290 | Target field |
| 291 | Light beam pathway |
| 292 | Light beam approach path |
| 293 | Target plant |
| 294 | Light beam departure path |
| 295 | Crossover zone |
| 296 | Wobble amplitude |
| 300 | Cultivator |
| 302 | Wheel |
| 310 | Vapor generator |
| 320 | Vapor cloud |
| 330 | Side panel |
| 340 | Front/rear panel |
| 390 | Agricultural field |
| 392 | Plant bed |

What is claimed is:

1. A cultivator, comprising:
a light emitter producing blue light with wavelengths from 365 nm to 488 nm;
a focusing device receiving light from the light emitter and focusing the light at a focus distance from the focusing device;
a light director positioned a distance from the focusing device and receiving light from the focusing device, the light director sequentially redirecting the light toward multiple target plants; and
a target tracking system configured to identify and track the multiple target plants,
wherein
the focus distance is greater than the distance from the focusing device to the light director,
the light director receives information from the target tracking system to maintain the light on one of the multiple target plants for 25 ms to 300 ms, the optical power intensity of the light at the one of the multiple target plants is from 300 W/cm$^2$ to 1,000 W/cm$^2$, and
wherein the light pathway forms a spot size at the focus distance of approximately 12 mm$^2$.

2. The cultivator of claim 1, wherein the light emitter includes an array of laser diodes.

3. The cultivator of claim 2, further comprising:
a first lens receiving light from the array of laser diodes and causing the light pathways from the laser diodes to diverge; and
a second lens receiving light from the first lens and causing the light pathways to converge.

4. The cultivator of claim 3, wherein the first lens causes the light pathways to expand.

5. The cultivator of claim 4, wherein at least one of the first lens and the second lens is a convex lens.

6. The cultivator of claim 4, wherein the light pathways form a spot size at the focus distance of approximately 12 mm$^2$.

7. The cultivator of claim 6, wherein the power intensity of the light in the 12 mm$^2$ spot is 500-900 W/cm$^2$.

8. The cultivator of claim 1, wherein the light emitter emits light at one or more wavelengths from 430 nm to 480 nm.

9. The cultivator of claim 1, wherein the focusing device expands the pathway in which the light travels.

10. The cultivator of claim 1, wherein the light director includes two reflectors and two motors, each motor including a rotator that rotates about a rotation axis, and each reflector is connected to a rotator.

11. The cultivator of claim 10, wherein the rotator of each motor is a motor housing.

12. The cultivator of claim 10, wherein the reflective area of each of the two reflectors are at least 3 square inches.

13. The cultivator of claim 1,
wherein the light director receives information from the target tracking system to maintain the light on a leaf of the target plant for 100-200 ms.

14. A cultivator, comprising:
means for generating light in two or more light pathways, wherein the light in each of the two or more light pathways has wavelengths from 365 nm to 488 nm;
means for focusing light propagating in the two or more light pathways at a focus distance; and
means for sequentially directing light propagating in the two or more pathways from the focusing means toward multiple target plants, wherein said means for sequentially directing includes maintaining the light on each of the multiple target plants for 25 ms to 300 ms;
wherein
the focus distance is greater than the distance from the focusing means to the light directing means,
the optical power intensity of the light is from 300 W/cm$^2$ to 1,000 W/cm$^2$ at the one of the multiple target plants and
the light pathways form a spot size at the focus distance of approximately 12 mm$^2$.

15. The cultivator of claim 14, wherein the light generating means includes means for generating blue light in two or more light pathways at one or more wavelengths from 430 nm to 480 nm.

16. The cultivator of claim 14, wherein the means for generating light includes an array of laser diodes, and the light focusing means includes a first lens receiving light from the array of laser diodes and causing the light pathways from the laser diodes to diverge and individually expand, and a second lens receiving light from the first lens and causing the light pathways to converge.

17. The cultivator of claim 16, wherein and the power intensity of the light onto the target plants spot is 500-900 W/cm$^2$.

18. The cultivator of claim 17, wherein the means for light directing includes two reflectors and two motors, each motor including a housing that rotates about a rotation axis, each reflector being connected to a rotator, and each of the reflectors having a reflective area of at least 3 square inches.

19. The cultivator of claim 18, further comprising:

a target tracking system configured to identify and track a target biological material, wherein the light director receives information from the target tracking system to maintain the light on the target plant for 100-200 ms.

* * * * *